(12) United States Patent
Li et al.

(10) Patent No.: US 12,495,589 B2
(45) Date of Patent: Dec. 9, 2025

(54) SEMICONDUCTOR DEVICE AND METHOD FOR MANUFACTURING THE SAME

(71) Applicant: INSTITUTE OF MICROELECTRONICS, CHINESE ACADEMY OF SCIENCES, Beijing (CN)

(72) Inventors: Yongliang Li, Beijing (CN); Anlan Chen, Beijing (CN); Fei Zhao, Beijing (CN); Xiaohong Cheng, Beijing (CN); Huaxiang Yin, Beijing (CN); Jun Luo, Beijing (CN); Wenwu Wang, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 466 days.

(21) Appl. No.: 18/087,347

(22) Filed: Dec. 22, 2022

(65) Prior Publication Data
US 2023/0326965 A1    Oct. 12, 2023

(51) Int. Cl.
| | |
|---|---|
| H01L 29/786 | (2006.01) |
| H01L 29/06 | (2006.01) |
| H01L 29/423 | (2006.01) |
| H01L 29/66 | (2006.01) |
| H01L 29/775 | (2006.01) |
| H10D 30/01 | (2025.01) |
| H10D 30/43 | (2025.01) |
| H10D 30/67 | (2025.01) |
| H10D 62/10 | (2025.01) |
| H10D 64/01 | (2025.01) |

(52) U.S. Cl.
CPC ......... *H10D 62/121* (2025.01); *H10D 30/014* (2025.01); *H10D 30/43* (2025.01); *H10D 30/6735* (2025.01); *H10D 30/6757* (2025.01); *H10D 64/017* (2025.01)

(58) Field of Classification Search
CPC .. H10D 30/014; H10D 30/43; H10D 30/6735; H10D 30/6757; H10D 62/118; H10D 62/119; H10D 62/121; H10D 64/017
See application file for complete search history.

(56) References Cited

U.S. PATENT DOCUMENTS

| | | | |
|---|---|---|---|
| 10,234,054 B1 * | 3/2019 | Yang | ......................... F16K 21/02 |
| 10,243,054 B1 * | 3/2019 | Cheng | .................. H10D 30/014 |
| 11,381,102 B2 * | 7/2022 | Tian | ...................... H02J 7/0071 |

(Continued)

*Primary Examiner* — David C Spalla
(74) *Attorney, Agent, or Firm* — Goodwin Procter LLP

(57) ABSTRACT

A semiconductor device and a method for manufacturing the same. The semiconductor device includes: a first gate-all-around (GAA) transistor disposed in the first region, including a first nanowire or nanosheet of at least one first layer, the at least one first layer and the substrate form a first group, among which all pairs of adjacent layers are separated by first distances, respectively; and a second GAA transistor disposed in the second region, including a second nanowire or nanosheet of at least two second layers, the at least two second layers and the substrate form a second group, among which the second layers are separated by second distances, respectively; where a minimum first distance is greater than a maximum second distance, and a quantity of the at least one first layer is less than a quantity of the at least two second layers.

20 Claims, 16 Drawing Sheets

(56) References Cited

U.S. PATENT DOCUMENTS

| | | | |
|---|---|---|---|
| 11,387,102 B2* | 7/2022 | Lee | H10D 30/62 |
| 2020/0066839 A1* | 2/2020 | Zhang | H10D 30/014 |
| 2020/0168715 A1* | 5/2020 | Wu | H01L 21/30604 |
| 2021/0184001 A1* | 6/2021 | Trivedi | H10D 84/038 |

* cited by examiner

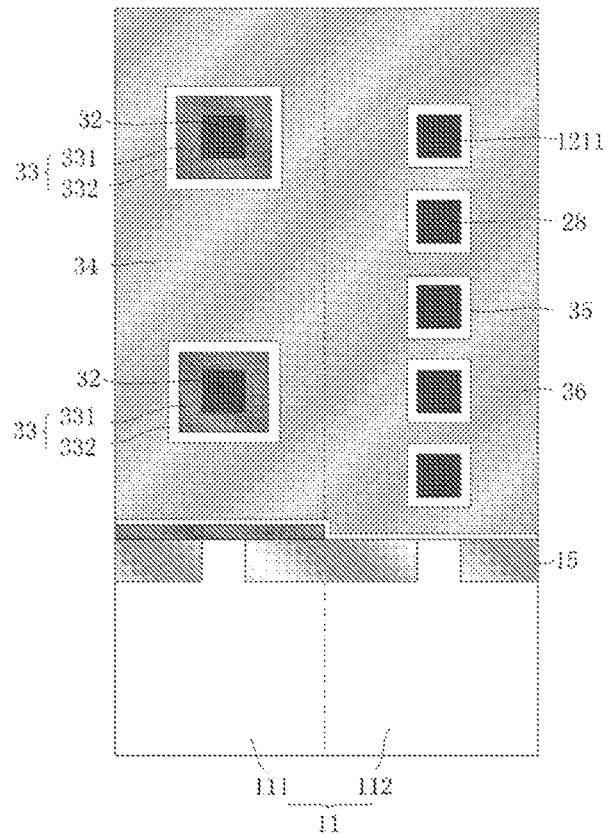

Figure 31

| Provide a substrate having a first region and a second region |
|---|

| Form a first GAA transistor in the first region and a second GAA transistor in the second region, where: each layer of a first nanowire or nanosheet in the first GAA transistor is spaced from a first structure adjacent to said layer by a first distance, and the first structure includes one or both of the substrate and another layer of the first nanowire or nanosheet; and each layer of a second nanowire or nanosheet in the second GAA transistor is spaced from a second structure adjacent to said layer by a second distance, and the second structure includes one or both of the substrate and another layer of the second nanowire or nanosheet; the first distance is greater than the second distance; and a quantity of layers of the first nanowire or nanosheet in the first GAA transistor is less than a quantity of layers of the second nanowire or nanosheet in the second GAA transistor |
|---|

Figure 32

SEMICONDUCTOR DEVICE AND METHOD FOR MANUFACTURING THE SAME

This application claims priority to Chinese Patent Application No. 202210307265.0, titled "SEMICONDUCTOR DEVICE AND METHOD FOR MANUFACTURING THE SAME," filed on Mar. 25, 2022 with the China National Intellectual Property Administration, which is incorporated herein by reference in its entirety.

FIELD

The present disclosure relates to the field of semiconductor technology, and in particular to a semiconductor device and a method for manufacturing the semiconductor device.

BACKGROUND

Gate-all-around (GAA) transistors are advantageous in, for example, a strong gate control capability in comparison with planar transistors and fin field-effect transistors. Therefore, operation performances of a semiconductor device and/or an integrated circuit can be improved when all transistors therein adopts the GAA structure.

A part of GAA transistors in the semiconductor device and/or the integrated circuit may have a thicker gate dielectric layer and/or a thicker gate than other GAA transistors. In such case, it is difficult to manufacture both the above two types of GAA transistors through conventional methods.

SUMMARY

An objective of the present disclosure is to provide a semiconductor device and a method for manufacturing the semiconductor device. Gate-all-around (GAA) transistors having thicker gate dielectric layers and/or thicker gates can be manufactured on a same substrate along with other GAA transistors in a semiconductor device and/or an integrated circuit. That is, the above two kinds of GAA transistors can be integrated with fewer difficulties.

In order to achieve the objective, a semiconductor device is provided according to an embodiment of the present disclosure. The semiconductor device includes: a first gate-all-around (GAA) transistor disposed in the first region, where the first GAA transistor comprises a first nanowire or nanosheet of at least one first layer, the at least one first layer and the substrate form a first group, and all pairs of adjacent layers among the first group are separated by first distances, respectively; and a second GAA transistor disposed in the second region, where the second GAA transistor comprises a second nanowire or nanosheet of at least two second layers, the at least two second layers and the substrate form a second group, and all pairs of adjacent layers among the second layers are separated by second distances, respectively; where a minimum one of the first distances is greater than a maximum one of the second distances, and a quantity of the at least one first layer is less than a quantity of the at least two second layers.

Embodiments of the present disclosure differ from conventional technology in following aspects. The first nanowire/nanosheet(s) in the first GAA transistor has fewer layers than the second nanowire/nanosheets in the second GAA transistor. Each layer of the first nanowire/nanosheet in the first GAA transistor is spaced from the first structure adjacent to said layer by the first distance. Each layer of the second nanowire/nanosheet in the second GAA transistor is spaced from the second structure adjacent to said layer by the second distance. On such basis, a first gate dielectric layer and a first gate in the first GAA transistor are sequentially disposed at least around the first nanowire/nanosheet(s), and a second gate dielectric layer and a second gate in the second GAA transistor are sequentially disposed at least the second nanowire/nanosheets. Hence, when the first distance is greater than the second distance, the thick first gate dielectric layer and/or the thick first gate would not render a space between the first nanowire/nanosheet and the substrate or between adjacent layers of the first nanowire/nanosheet too small when manufacturing the first GAA transistor and the second GAA transistor on a same substrate, even if the first gate dielectric layer and/or the first gate are thicker than the second gate dielectric layer and/or the second gate, respectively. Therefore, it is prevented that only a part of the first gate dielectric layer can be filled into the space, and/or that none or only a part of the first gate can be filled into such space. That is, a GAA transistor having a thicker gate dielectric layer and/or a thicker gate can be manufactured on a same substrate along with other GAA transistors, while ensuring that thicknesses of the first gate dielectric layer and the first gate in the first GAA transistor, and of the second gate dielectric layer and the second gate in the second GAA transistor, can all meet operating requirements. Integration of the first GAA transistor and the second GAA transistor is less difficult, and both the above two types of GAA transistors have higher yields.

A method for manufacturing a semiconductor device is further provided according to embodiments of the present disclosure. The method includes: providing a substrate having a first region and a second region; and forming a first GAA transistor in the first region and a second GAA transistor in the second region; where: the first GAA transistor comprises a first nanowire or nanosheet of at least one first layer, the at least one first layer and the substrate form a first group, and all pairs of adjacent layers among the first group are separated by first distances, respectively; the second GAA transistor comprises a second nanowire or nanosheet of at least two second layers, the at least two second layers and the substrate form a second group, and all pairs of adjacent layers among the second layers are separated by second distances, respectively; a minimum one of the first distances is greater than a maximum one of the second distance; and a quantity of the at least one first layer is less than a quantity of the at least two second layers.

In comparison with the conventional technology, beneficial effects of the method are the same as those of the foregoing semiconductor device, and hence are not repeated herein.

BRIEF DESCRIPTION OF THE DRAWINGS

Drawings illustrated hereinafter are intended for better understanding of the present disclosure and constitute a part of the present disclosure. Illustrative embodiments and description thereof are intended for explaining the present disclosure, and do not constitute any improper limitation to the present disclosure.

FIG. 31 is a structural diagram of a section of a semiconductor device along direction A-A' according to another embodiment of the present disclosure.

FIG. 32 is a flowchart of a method for manufacturing a semiconductor device according to an embodiment of the present disclosure.

Figure 1:
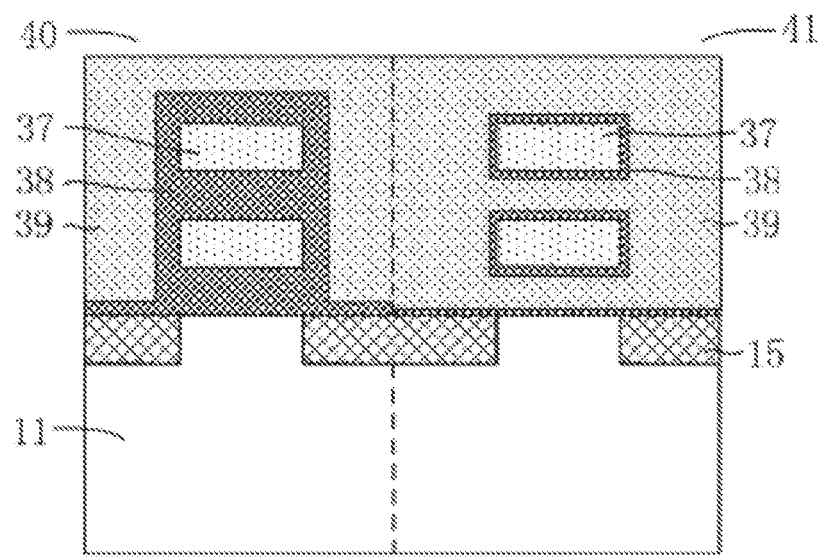
FIG. 1 is a schematic diagram of a GAA core transistor and a GAA input/output transistor which are integrated in conventional technology.

| Reference signs: | | |
| --- | --- | --- |
| 11: substrate; | 111: first region; | 112: second region; |
| 12: stacking material layer; | 121: stacking period; | 1211: first material layer; |
| 1212: third material layer; | 13: first fin structure; | 131: first fin; |
| 14: second fin structure; | 141: second fin; | 15: shallow trench isolation; |
| 16: source region; | 17: drain region; | 18: transition region; |
| 19: first stacking structure; | 20: second stacking structure; | 21: sacrificial gate; |
| 22: sidewall; | 23: first source; | 24: first drain; |
| 25: second source; | 26: second drain; | 27: dielectric layer; |
| 28: second nanowire/nanosheet; | 29: first mask layer; | 291: first mask portion; |
| 292: second mask portion; | 30: second mask layer; | 31: second material layer; |
| 32: first nanowire/nanosheet; | 33: first gate dielectric layer; | 331: gate oxide layer; |
| 332: gate insulation layer; | 34: first gate; | 35: second gate dielectric layer; |

-continued

Reference signs:

| | | |
|---|---|---|
| 36: second gate; | 37: channel; | 38: gate dielectric layer; |
| 39: metal gate; | 40: input/output transistor; | 41: core transistor. |

DETAILED DESCRIPTION

Hereinafter embodiments of the present disclosure are described with reference to the drawings. It should be understood that the description are only illustrative and are not intended for limiting the scope of the present disclosure. Description of well-known structures and technologies is omitted in the following description, in order to avoid unnecessary confusion on concepts of the present disclosure.

Schematic diagrams of various structures according to embodiments of the present disclosure are shown in the drawings. The drawings are not drawn to scale, some details are enlarged for clearer illustration, and some details may be omitted. Shapes of various regions and layers, and relative sizes and positions among the regions and layers, as shown in the drawings are only illustrative and may deviate from practice due to manufacturing tolerance or technical restrictions. Those skilled in the art can design another region or layer having a different shape, a different size, or a different relative position on requirement.

In context of the present disclosure, when a layer/element is described as being "on" another layer/element, the layer/element may be directly on the other layer/element, or there may be an intermediate layer/element between the two. When a layer/element is "on" another layer/element in one orientation, the layer/element may be "under" the other layer/element when that the orientation is reverted. In order to clarify to-be-addressed technical problems, technical solutions, and beneficial effects of the present disclosure, hereinafter the present disclosure is described in further details in conjunction with the drawings and embodiments. It should be understood that specific embodiments described herein are merely intended for explaining rather than limiting the present disclosure.

In addition, terms "first" and "second" are only used for description and should not be construed as indicating or implying relative importance, or as specifying a quantity of indicated technical features implicitly. Therefore, an object correlated with the term "first" or "second" may include one or more such objects explicitly or implicitly. In the description, unless otherwise limited, the term "multiple" means two or more and "several" means one or more.

In the description of the present disclosure, unless otherwise specified and limited, terms "installation," "coupled," and "connection" should be broadly interpreted. For example, these terms may indicate a fixed connection, a removable connection, or an integral connection, may indicate a mechanical connection or an electrical connection, may indicate a direct connection or an indirect connection via an intermediate medium, may indicate an connection between inner space of two components, or may indicated an interaction between two components. Those of ordinary skills in the art can understand specific meaning of such terms herein based on specific context.

Gate-all around GAA transistors is advantageous in, for example, a higher gate control capability in comparison with planar transistors and fin field-effect transistors. Therefore, operation performances of a semiconductor device and/or an integrated circuit can be improved when all transistors therein adopts the GAA structure. A part of GAA transistors in the semiconductor device and/or the integrated circuit may have a thicker gate dielectric layer and/or a thicker gate than other GAA transistors. In such case, it is difficult to manufacture both the above two kinds of GAA transistors through conventional methods.

An integrated circuit having an input/output (IO) transistor and a core transistor is taken as an example for illustrating difficulties of manufacturing the above two kinds of GAA transistors when the part of the GAA transistors have thicker gate dielectric layers. The input/output transistor has the thick gate dielectric layer because it bears a large voltage (which is usually 1.8V, 2.5V, 3.3V, 5V, or the like) during operation. There are a lot of core transistors in a chip, and hence generally the core transistors operate under a lower voltage (which is usually 1.0V, 1.2V, or the like) to reduce power consumption and improve operation speed. Accordingly, the core transistor have thinner gate dielectric layer. Reference is made to FIG. 1. When manufacturing a GAA core transistor and a GAA input/output transistor on a same substrate in practice, a gate dielectric layer 38 (which is thin) surrounding a channel 37 of a core transistor 41 is formed in a core-device region of a substrate 11, and a gate dielectric layer 38 (which is thick) surrounding a channel 37 of an input/output transistor 40 is formed in an IO-device region of the substrate 11. A distance between adjacent nanowire/nanosheets only meets a structural requirement of the core transistor 41. Hence, after being formed, the thick gate dielectric layer 38 of the input/output transistor 40 has occupied the whole of a small gap between adjacent nanowire/nanosheets, or only leaves a tiny space between the nanowire/nanosheets for forming a gate subsequently. Hence, a metal gate 39 meeting an operating requirement of the input/output transistor 40 cannot be subsequently formed within the gap or the tiny space due to the insufficient space, that is, the space between adjacent nanowire/nanosheets is "pinched off" in the IO-device region. Thereby, electrical performances of the input/output transistor 40 formed on the IO-device region are reduced. That is, it is difficult to integrate the GAA core transistor 41 and the GAA input/output transistor 40, and operating performances of the input/output transistor 40 are reduced.

In addition, the above two types of GAA gate transistors in one semiconductor device usually have gate dielectric layers and/or gates of different thicknesses, so as to have different threshold voltages. As discussed above, when manufacturing the two types of GAA transistors on the same substrate, the distance between adjacent nanowire/nanosheets only meets the structural requirement of the GAA transistor having the thin gate dielectric layer and/or the thin gate, and hence the thick gate dielectric layer and/or the thick gate cannot be formed between the adjacent nanowire/nanosheets which are spaced by an insufficient distance. As a result, a threshold voltage corresponding to the GAA transistor having the thick gate dielectric layer and/or the thick gate can hardly meet a requirement of a preset scheme, which reduces a yield and operating performances of the semiconductor device In order to address the above technical issue, a semiconductor device and a method for manufacturing the semiconductor device are provided according to embodiments of the present disclosure. In the semiconductor device, a quantity of layers of a first nanowire/nanosheet in a first GAA transistor is less than a quantity of layers of a second nanowire/nanosheet in a second GAA transistor. In addition, each of the layers of the first nanowire/nanosheet is spaced from a first structure adjacent to such layer by a first distance, each of the layers of the second nanowire/nanosheet is spaced from a second structure adjacent to such layer by a second distance, and the first distance is greater than the second distance. On such basis, the thick first gate dielectric layer and/or the thick first gate would not render a space between the first nanowire/nanosheet and the substrate or between adjacent layers of the first nanowire/nanosheet too small when manufacturing the first GAA transistor and the second GAA transistor on a same substrate, even if the first gate dielectric layer and/or the first gate are thicker than the second gate dielectric layer and/or the second gate, respectively. Therefore, it is prevented that only a part of the first gate dielectric layer can be filled into the space, and/or that none or only a part of the first gate can be filled into such space.

Reference is made to FIG. 24, FIG. 25, and FIG. 28 to FIG. 31. A semiconductor device is provided according to an embodiment of the present disclosure. The semiconductor device includes a substrate 11, a first GAA transistor, and a second GAA transistor. The substrate 11 has a first region 111 and a second region 112. The first GAA transistor is formed in the first region 111. Each layer of a first nanowire/nanosheet 32 in the first GAA transistor is spaced from a first structure adjacent to such layer by a first distance, and the first structure refers to the substrate 11 and/or another layer of the first nanowire/nanosheet 32 adjacent to such layer. The second GAA transistor is formed in the second region 112. Each layer of the second nanowire/nanosheet 28 in the second GAA transistor is spaced from a second structure adjacent to such layer by a second distance, and the second structure refers to the substrate 11 and/or another layer of the second nanowire/nanosheet 28 adjacent to such layer. The first distance is greater than the second distance. A quantity of layers of the first nanowire/nanosheet 32 in the first GAA transistor is less than a quantity of layers of the second nanowire/nanosheet 28 in the second GAA transistor.

In an embodiment, the substrate may be a silicon substrate, a silicon-on-insulator substrate, a silicon germanium substrate, a germanium substrate, or any other semiconductor substrate. Reference is made to FIG. 24, FIG. 25, and FIG. 28 to FIG. 31. The first GAA transistor is formed in the first region 111 on the substrate 11. Therefore, a position and a quantity of first regions 111 on the substrate 11 may be set based on a position and a quantity of first GAA transistors that are to be formed on the substrate 11. The second GAA transistor is formed in the second region 112 on the substrate 11. Therefore, a position and a quantity of second regions 112 on the substrate 11 may be set based on a position and a quantity of second GAA transistors that are to be formed on the substrate 11.

Reference is made to FIG. 24, FIG. 25, and FIG. 28 to FIG. 31. In some embodiments, shallow trench isolation 15 configured to define an active region is further formed on the substrate 11. An insulating material such as SiN, $Si_3N_4$, $SiO_2$, and SiCO may be filled into the shallow trench isolation 15.

Figure 24:
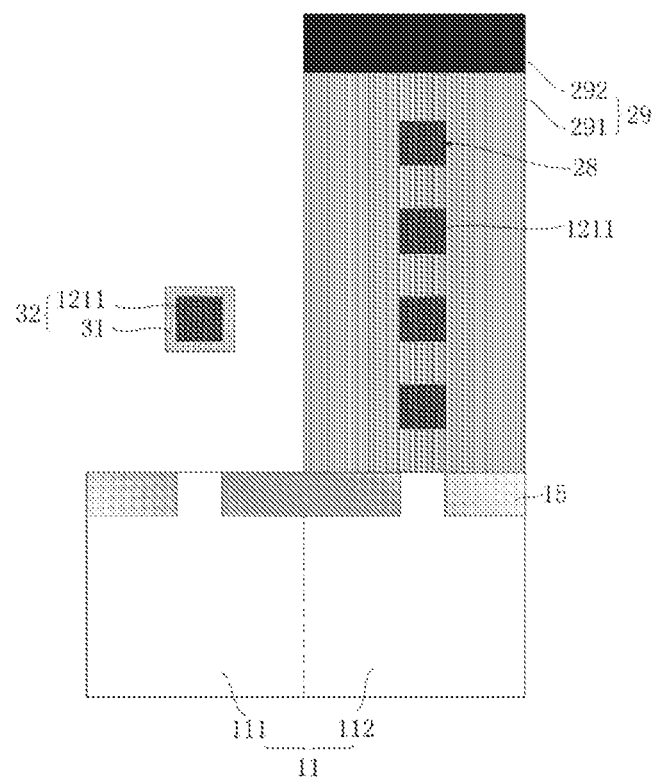
FIG. 24 is a structural diagram of a section along direction A-A' after removing a second mask layer and remaining to-be-removed layer(s) according to another embodiment of the present disclosure.
Figure 25:
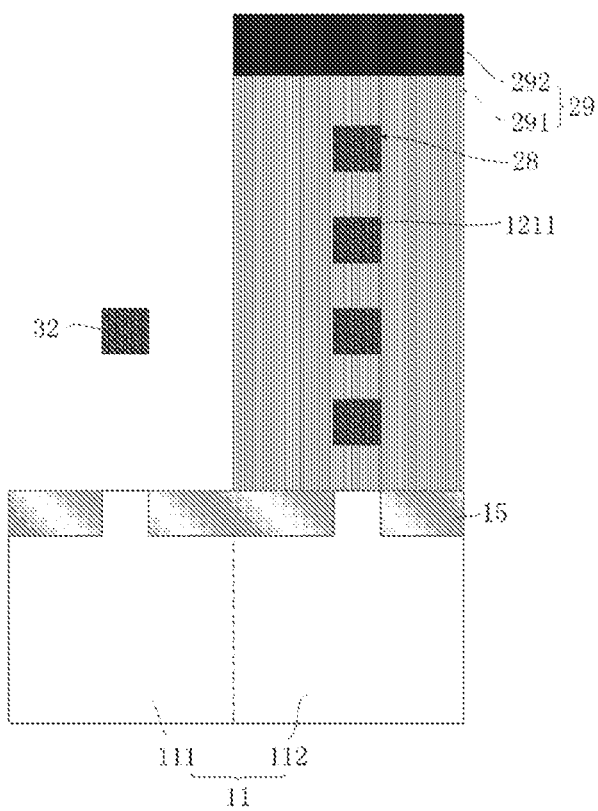
FIG. 25 is a structural diagram of a section along direction A-A' after removing a second material layer completely according to another embodiment of the present disclosure.

The first GAA transistor includes at least one layer of first nanowire/nanosheet. The second GAA transistor includes at least two layers of second nanowire/nanosheet. Specific quantities of layers of the first nanowire/nanosheet and layers of the second nanowire/nanosheet may be set based on an actual requirement, as long as they are applicable to a semiconductor device according to an embodiment of the present disclosure. In addition, a specific form of the first structure adjacent to a layer of the first nanowire/nanosheet depends on a position of such layer. As shown in FIG. 24 and FIG. 25, the first structure adjacent to the first nanowire/nanosheet 32 includes only the substrate 11, in a case that the first GAA transistor includes only one layer of the first nanowire/nanosheet 32. As shown in FIG. 28 to FIG. 31, the layers of the first nanowire/nanosheet 32 are named based on a bottom-top order, in a case that the first GAA transistor includes two or more layers of the first nanowire/nanosheet 32. It is noted that hereinafter other objects are named in a similar way according to the bottom-top order. Accordingly, the first structure adjacent to a first layer of the first nanowire/nanosheet 32 refers to the substrate 11 and a second layer of the first nanowire/nanosheet 32. The first structure adjacent to a layer, other than the first layer or the topmost layer, of the first nanowire/nanosheet 32 refers to layers of the first nanowire/nanosheet 32 which are immediately previous and immediately subsequent to such layer in sequential number. The first structure adjacent to the topmost layer of the first nanowire/nanosheet 32 refers to only the layer of first nanowire/nanosheet 32 which is immediately previous to the topmost layer in sequential number. The second structure adjacent to each layer of the second nanowire/nanosheet 28 may be deduced in a similar manner, which is not illustrated in detail herein.

Magnitude of the first distances may be set based on a requirement on thicknesses of the first gate dielectric layer and the first gate in the first GAA transistor in an actual application scenario. In a case that the first GAA transistor has two or more layers of the first nanowire/nanosheet, for each layer other than the topmost layer of the first nanowire/nanosheet, the first distance between such layer and one of the two adjacent first structures may be identical to or different from the first distance between such layer and the other of the two adjacent first structures. Reference is made to FIG. 28 to FIG. 31. As an example, the first distance between the first layer of the first nanowire/nanosheet 32 and the substrate 11 may or may not be equal to the first distance between the first layer and the second layer of the first nanowire/nanosheet 32. Reference is further made to FIG. 31. As an example, the first GAA transistor has at least two layers of first nanowire/nanosheet 32, and at least one layer other than the topmost layer of the first nanowire/nanosheet 32 has different first distances to the two adjacent first structures. In such case, since the two first distances corresponding to the layer of the first nanowire/nanosheet therebetween are not required to be identical, it is not necessary to put strict limitations on sequential number(s) of first material layer(s) 1211, which are removed during manufacture of the semiconductor device. Hence, semiconductor devices according to embodiments of the present disclosure can be manufactured through various manners, and have higher applicability to different application scenarios.

In a case that the first GAA transistor has two or more layers of the first nanowire/nanosheet, the first distances corresponding different layers of the first nanowire/nanosheet may be identical or different. For example, the first distance between the first layer of the first nanowire/nanosheet and the substrate may or may not be equal to the first distance between the second layer of the first nanowire/nanosheet and the third layer of first nanowire/nanosheet.

Reference is made to FIG. 31. As an example, the first GAA transistor has two or more layers of the first nanowire/nanosheet 32. For at least one layer of the first nanowire/nanosheet 32, the first distance corresponding to such layer is not equal to that corresponding to another layer of the first nanowire/nanosheet 32. In such case, since the two first distances corresponding to different layers of the first nanowire/nanosheet are not required to be identical, it is not necessary to put strict limitations on sequential number(s) of first material layer(s) 1211, which are etched during manufacture of the semiconductor device. Hence, semiconductor devices according to embodiments of the present disclosure can be manufactured through various manners, and have higher applicability to different application scenarios.

Magnitude of the second distances may be set based on a requirement on thicknesses of the second gate dielectric layer and the second gate in the second GAA transistor in an actual application scenario. Reference is made to FIG. 24, FIG. 25, and FIG. 28 to FIG. 31. Each layer other than the topmost layer of the second nanowire/nanosheet 28 is spaced from two adjacent second structures by two second distances, respectively. Such two second distances may or may not be equal to each other. Reference is made to FIG. 24, FIG. 25, and FIG. 28 to FIG. 31. As an example, the second distance between the second layer and the first layer of the second nanowire/nanosheet 28 may or may not be equal to the second distance between the second layer and the third layer of the second nanowire/nanosheet 28. Reference is further made to FIG. 24, FIG. 25, and FIG. 28 to FIG. 31. As an example, at least one layer other than the topmost layer of the second nanowire/nanosheet 28 is spaced from the two adjacent second structures by equal second distances. In such case, as shown in FIGS. 2 to 31, at least one pair of adjacent third material layers 1212, which are from different stacking periods 121, has equal thicknesses. On such basis, duration of etching can be controlled with less complexity when removing the third material layer 1212 from the second region 112 to release the first material layers 1211 in the second region 112, because different thicknesses of the third material layers 1212 would result in different etching progresses of the third material layers 1212 under the same etching duration. In addition, a yield of the second GAA transistor is improved, because the first material layer 1211 which is to be preserved would be partially removed when the etching duration is long enough for ensuring the thickest third material layer 1212 being completely etched.

In addition, the second distance corresponding to each layer of the second nanowire/nanosheet may or may not be equal to the second distance corresponding to another layer of the second nanowire/nanosheet. Reference is made to FIG. 24, FIG. 25, and FIG. 28 to FIG. 31. As an example, the second distance between the first layer of the second nanowire/nanosheet 28 and the substrate 11 may or may not be equal to the second distance between the second layer and the third layer of the second nanowire/nanosheet 28. Reference is further made to FIG. 24, FIG. 25, and FIGS. 28 to 31. As an example, for at least one layer of the second nanowire/nanosheet 28, the corresponding second distance is equal to the second distance corresponding to another layer of the second nanowire/nanosheet 28. Beneficial effects achieved in such case may refer to those achieved through the aforementioned configuring equal second distances for the same layer of the second nanowire/nanosheet 28, and are not repeated herein.

A difference between the first distance and the second distance may be set based on a process of forming the first nanowire/nanosheet and the second nanowire/nanosheet, an actual application scenario, or the like. Reference is made to FIG. 2 to FIG. 19. As an example, the first nanowire/nanosheet 32 and the second nanowire/nanosheet 28 are manufactured through same stacking material periods 12. In a case that only the first material layer(s) 1211 having odd sequential number(s) (for example, the first layer, the third layer, and so on, among the first material layers 1211) in the first region 111 are removed, the first distance is equal to a sum of the thickness of the first material layer 1211 and twice the second distance.

Figure 27:
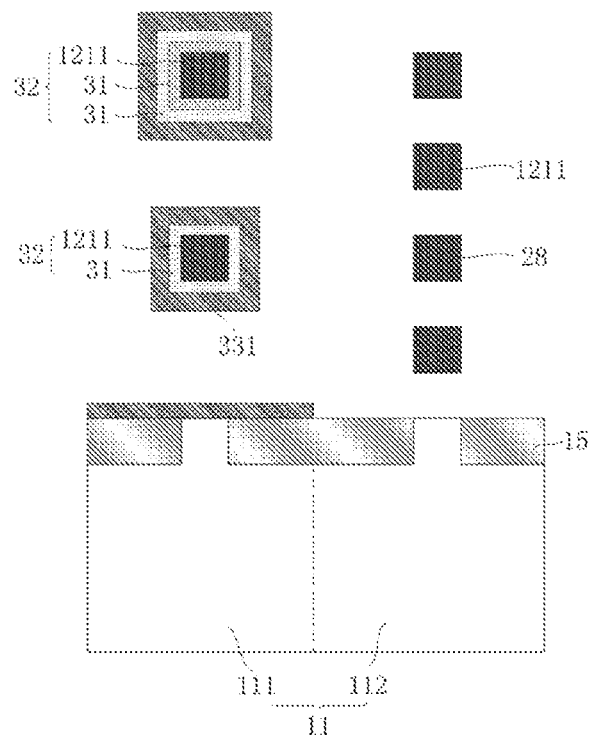
FIG. 27 is a structural diagram of a section along direction A-A' after removing a gate oxide layer in a second region selectively according to an embodiment of the present disclosure.
Figure 28:
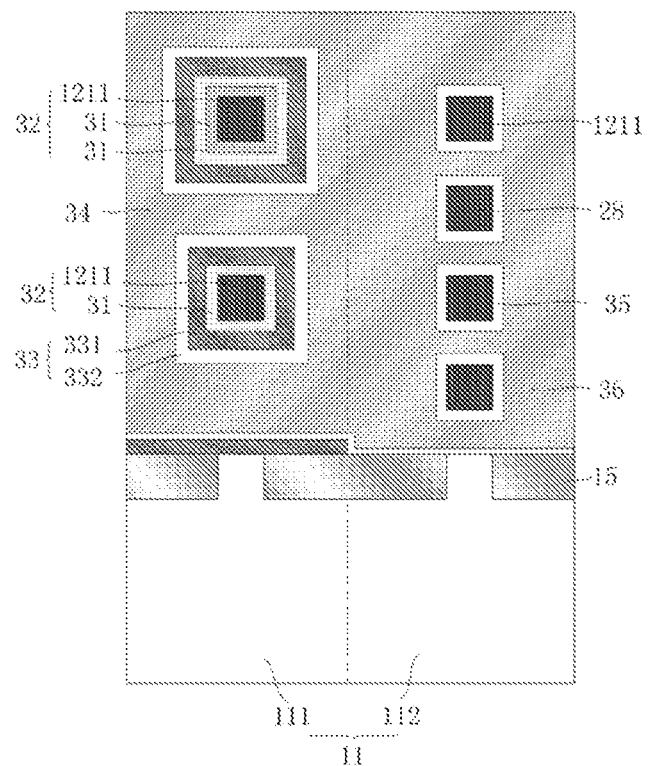
FIG. 28 is a structural diagram of a section of a semiconductor device along direction A-A' according to an embodiment of the present disclosure.
Figure 29:
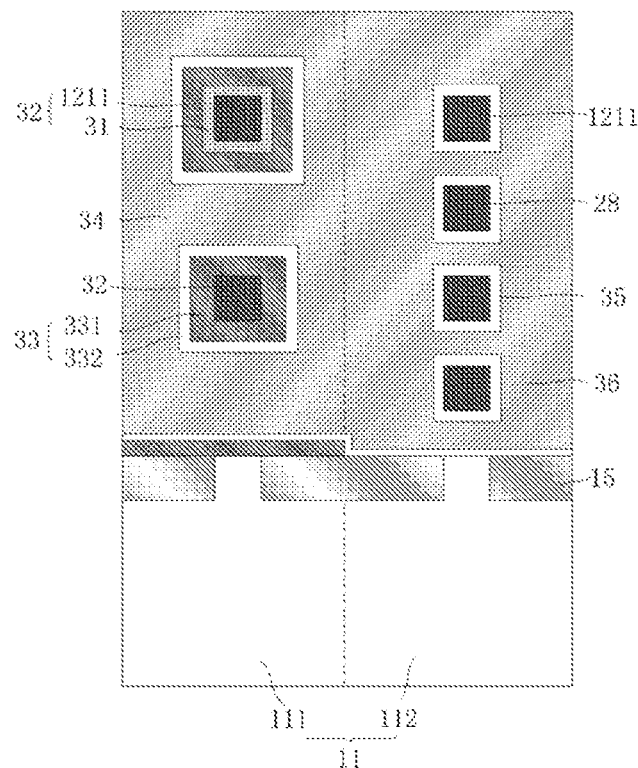
FIG. 29 is a structural diagram of a section of a semiconductor device along direction A-A' according to another embodiment of the present disclosure.
Figure 30:
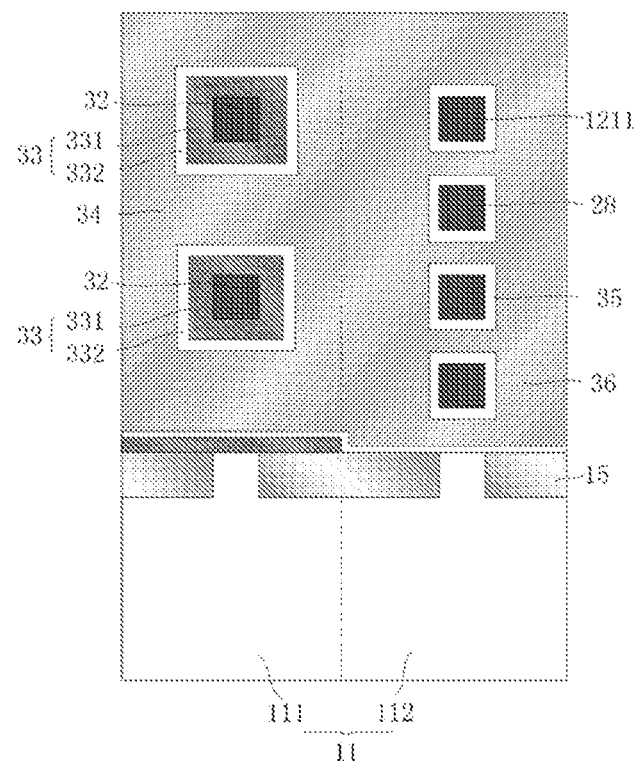
FIG. 30 is a structural diagram of a section of a semiconductor device along direction A-A' according to another embodiment of the present disclosure.

A material and a thickness of the first nanowire/nanosheet and the second nanowire/nanosheet may be set based on an actual application scenario. The first nanowire/nanosheet may be identical to, or different from, the second nanowire/nanosheet in material and/or thickness. Reference is made to FIG. 2 to FIG. 31. In an embodiment, the first nanowire/nanosheet 32 and the second nanowire/nanosheet 28 are manufactured through the same stacking material periods 12, and the second material layers 31 surrounding each layer of the first nanowire/nanosheet 32 are completely removed after the first nanowire/nanosheet 32 is formed. In such case, the material of the first nanowire/nanosheet 32 is the same as that of the second nanowire/nanosheet 28, and the thickness of the first nanowire/nanosheet 32 is the same as that of the second nanowire/nanosheet 28. Both the first nanowire/nanosheet 32 and the second nanowire/nanosheet 28 may be made of $Si_{1-x}Ge_x$, where $0 \leq x \leq 1$. For example, they may be made of Si, $Si_{0.5}Ge_{0.5}$, or the like. Reference is made to FIG. 2 to FIG. 18, and FIG. 24. The first nanowire/nanosheet 32 and the second nanowire/nanosheet 28 are manufactured through the same stacking material periods 12, and all or a part of the second material layers 31 surrounding each layer of the first nanowire/nanosheet 32 are retained after the first nanowire/nanosheet 32 is formed. In such case, the material of the first nanowire/nanosheet 32 is not exactly the same as the material of the second nanowire/nanosheet 28. Reference is made to FIG. 24, FIG. 28, and FIG. 29. As an example, at least one layer of the first nanowire/nanosheet 32 includes the first material layer 1211 and the second material layer 31 surrounding the first material layer 1211, a material of the first material layer 1211 is different from that of the second material layer 31, and the second nanowire/nanosheet 28 includes the first material layer 1211. In an embodiment, only one layer (i.e., the topmost layer) of the first nanowire/nanosheet 32 may include the first material layer 1211 and the second material layer 31. Alternatively, at least two layers of the first nanowire/nanosheet 32 may include the first material layer 1211 and the second material layer 31. Apparently, as another alternative, all layers of the first nanowire/nanosheet 32 disposed above the first region 111 may include the first material layer 1211 and the second material layer 31. The first material layer 1211 and the second material layer 31 may be made of different semiconductor materials. For example, the first material layer 1211 is made of $Si_{1-y}Ge_y$, where $0 \leq y \leq 1$, and the second material layer 31 is made of $Si_{1-z}Ge_z$, where $0 \leq z \leq 1$ and $|y-z| \geq 0.2$.

In an embodiment, the first GAA transistor has at least two layers of the first nanowire/nanosheet, which each includes the first material layer and the second material layer. In such case, the second material layers included in different layers of the first nanowire/nanosheet may or may not be exactly the same. Reference is made to FIG. 24, FIG. 25, and FIG. 28 to FIG. 31. As an example, the first GAA transistor has at least two layers of first nanowire/nanosheet 32, and at least two layers of the first nanowire/nanosheet 32 each includes the first material layer 1211 and the second material layer 31. The second material layers 31 included in different layers of the first nanowire/nanosheet 32 are made of materials which are not completely the same, and have different thicknesses. As an alternative, the second material layers 31 included in different layers of the first nanowire/nanosheet 32 are made of the same material and have different thicknesses.

Reference is made to FIG. 2 to FIG. 31. The first material layers 1211, which are spaced by small distances in the first region 111, are subject to deposition and etching to obtain the first nanowire/nanosheet 32. The deposition is configured to form second material layer(s) 31 surrounding the first material layer(s) 1211 that have been preserved. Thereby, the second material layer 31 can protect the to-be-preserved layer when removing a to-be-removed layer. In such case, the second material layer 31 is deposited on a structure, which is currently exposed, each time the deposition is performed. In a case that the second material layer 31 deposited each time is made of the same material, the obtained different layers of the first nanowire/nanosheet 32 is made of the same material. In a case that the second material layer 31 deposition in at least one deposition process includes a different material than the second materials 31 deposited in other deposition processes and such different second material layer is not removed, the second material layers 31 in the different layers of the first nanowire/nanosheet 32 would be made of materials which are not completely the same. Moreover, the larger the sequential number of a layer of the first nanowire/nanosheet 32 is, the more the second material layers 31 included on such layer are, and the greater the total thickness of the second material layers 31 are. In an embodiment, a material, a quantity of layers, and a thickness of the second material layers 31 included in the first nanowire/nanosheet 32 may be set based on an actual application scenario, which is not limited herein.

Reference is made to FIG. 7 to FIG. 31. The first GAA transistor further includes a first source 23, a first drain 24, a first gate dielectric layer 33, and a first gate 34. The first nanowire/nanosheet 32 is disposed between the first source 23 and the first drain 24, and is in contact with the first source 23 and the first drain 24. The first gate dielectric layer 33 and the first gate 34 are sequentially disposed at least around the first nanowire/nanosheet 32. The second GAA transistor further includes a second source 25, a second drain 26, a second gate dielectric layer 35, and a second gate 36. The second nanowire/nanosheet 28 is disposed between the second source 25 and the second drain 26, and is in contact with the second source 25 and the second drain 26. The second gate dielectric layer 35 and the second gate 36 are sequentially disposed at least around the second nanowire/nanosheet 28.

The first source, the first drain, the second source, and the second drain may be made of semiconductor materials such as Si and Ge, and may or may not be made of the same material. The first gate dielectric layer and the second gate dielectric layer may be made of insulating materials having a low dielectric constant, such as silicon oxide or silicon nitride, or insulating materials with a high dielectric constant, such as $HfO_2$, $ZrO_2$, $TiO_2$ or $Al_2O_3$. The first gate dielectric layer may be identical to, or different from, the second gate dielectric layer in material and thickness. The material and the thickness may be set based on an actual application scenario for the first gate dielectric layer and the second gate dielectric layer.

In actual applications, the first GAA transistor and the second GAA transistor have different operating performances when the first gate dielectric layer and the thickness of the second gate dielectric layer have different thicknesses. Reference is made to FIG. 28 to FIG. 31. As an example, a thickness of the first gate dielectric layer 33 in the first GAA transistor may be greater than a thickness of the second gate dielectric layer 35 in the second GAA transistor. In such case, an absolute value of an operating voltage of the first GAA transistor is greater than that of the second GAA transistor. Thereby, addressed is the "pinching-off" issue, which is of the GAA transistor having a thick gate dielectric layer and due to integration of two GAA transistors having different operating voltages in conventional technology. Accordingly, the thickness of the gate dielectric layer and the operation type of each of the two GAA transistors may be set based on a requirement of an actual application scenario on operating voltages of the two GAA transistors. Reference is made to FIG. 28 to FIG. 31. As an example, the thickness of the first gate dielectric layer 33 in the first GAA transistor is greater than the thickness of the second gate dielectric layer 35 in the second GAA transistor, and hence the first GAA transistor may serve as an input/output transistor while the second GAA transistor may serve as a core transistor. It is appreciated that as an alternative, the first GAA transistor may serve as a transistor of another type requiring a relatively high operating voltage in the integrated circuit, and/or the second GAA transistor may serve as a transistor of another type requiring a relatively low operating voltage in the integrated circuit.

In addition, each of the first gate dielectric layer and the second gate dielectric layer may be of a single-layer structure, or a stacking structure including at least two insulating layers. Specific structures of the first gate dielectric layer and the second gate dielectric layer may be configured based on an actual application scenario. Reference is made to FIG. 28 to FIG. 31. As an example, the first GAA transistor serves as an input/output transistor, and the first gate dielectric layer 33 in the first GAA transistor may be of a stacking structure. In an embodiment, the first gate dielectric layer 33 includes a gate oxide layer 331 and a gate insulation layer 332 on the gate oxide layer 331. The gate oxide layer 331 is formed at least around the first nanowire/nanosheet 32, and may be made of silicon oxide, silicon oxynitride, or the like. The gate insulating layer 332 may be any aforementioned insulating material having a high dielectric constant. Thicknesses of the gate oxide layer 331 and the gate insulation layer 332 may be set based on an operating voltage of the first GAA transistor, and are not limited herein.

Materials and thicknesses of the first gate and the second gate may be set based on an actual application scenario. For example, the first gate and the second gate may be made of conductive materials, such as TiN, TaN or TiSiN. The first gate may be identical to or different from the second gate in material and/or thickness. As an example, the thickness of the first gate in the first GAA transistor may be greater than that of the second gate in the second GAA transistor. Thereby, addressed is the "pinching-off" issue which is of the GAA transistor having a thick gate and due to integration of two GAA transistors having gates of different thicknesses in conventional technology.

Reference is made to FIG. 24, FIG. 25, and FIG. 28 to FIG. 31. The first gate dielectric layer 33 and the first gate 34 in the first GAA transistor is sequentially disposed at least around the first nanowire/nanosheet 32, and the second gate dielectric layer 35 and the second gate 36 in the second GAA transistor is disposed at least around the second nanowire/ nanosheet 28. Hence, when the first distance is greater than the second distance, the thick first gate dielectric layer 33 and/or the thick first gate 34 would not render a space between the first nanowire/nanosheet 32 and the substrate 11 or between adjacent layers of the first nanowire/nanosheet 38 too small when manufacturing the first GAA transistor and the second GAA transistor on the same substrate 11, even if the first gate dielectric layer 33 and/or the first gate 34 are thicker than the second gate dielectric layer 35 and/or the second gate 36, respectively. Therefore, it is prevented that only a part of the first gate dielectric layer 33 can be filled into the space, and/or that none or only a part of the first gate 34 can be filled into such space. That is, a GAA transistor having a thicker gate dielectric layer and/or a thicker gate can be manufactured on the same substrate 11 along with other GAA transistors, while ensuring that thicknesses of the first gate dielectric layer 33 and the first gate 34 in the first GAA transistor, and of the second gate dielectric layer 35 and the second gate 36 in the second GAA transistor, can all meet operating requirements. Integration of the first GAA transistor and the second GAA transistor is less difficult, and both the above two types of GAA transistors have higher yields.

Reference is made to FIG. 6 to FIG. 31. In some embodiments, the first GAA transistor and the second GAA transistor may be provided with a sidewall 22 and a dielectric layer 27 during manufacture. The dielectric layer 27 covers the first region 111 and the second region 112. The dielectric layer 27 in the first region 111 has a portion flush with a top of the first gate 34, and the dielectric layer 27 in the second region 112 has a portion flush with a top of the second gate 36. Reference is further made to FIG. 8 to FIG. 31.

During manufacturing the semiconductor device according to an embodiment of the present disclosure, the dielectric layer 27 can protect the first source 23, the first drain 24, the second source 25, and the second drain 26 from operations such as etching and rinsing when the sacrificial gate 21 or the third material layer 1212 is being etched. In an embodiment, the dielectric layer 27 may be made of an insulating material such as $SiO_2$ or SiN.

Reference is made to FIG. 6 to FIG. 31. The sidewall 22 in the first GAA transistor may be disposed between the dielectric layer 27 and a gate stack which includes the first gate dielectric layer 33 and the first gate 34. The sidewall 22 in the second GAA transistor may be disposed at least between the dielectric layer 27 and a gate stack which includes the second gate dielectric layer 35 and the second gate 36. The sidewall 22 facilitates forming the gate stacks in the first GAA transistor and the second GAA transistor, and separates the gate stacks from a subsequently formed conductive structure. The sidewall 22 is made of an insulating material. A material and a thickness of the sidewall 22 may be set based on an actual application scenario, and are not specifically limited herein.

Reference is made to FIG. 32. A method for manufacturing a semiconductor device is further provided according to an embodiment of the present disclosure. Hereinafter a process of manufacturing is described with reference to FIGS. 2 to 31, which show stereoscopic views or sectional views corresponding to operations in the manufacturing. In an embodiment, the method includes following steps.

A substrate is first provided. The substrate has a first region and a second region. Details may refer to the forgoing description concerning a material of the substrate, a structure of the substrate, and positions of the first region and the second region on the substrate, and are not repeated herein.

Reference is made to FIG. 2 to FIG. 31. A first GAA transistor is formed in the first region 111, and a second GAA transistor is formed in the second region 112. The first GAA transistor includes layer(s) of first nanowire/nanosheet 32, and each layer of the first nanowire/nanosheet 32 is spaced from a first structure adjacent to such layer by a first distance. The first structure is a substrate 11 and/or another layer of the first nanowire/nanosheet 32 adjacent to such layer of first nanowire/nanosheets 32. The second GAA transistor includes layer(s) of second nanowire/nanosheet 28, and each layer of the second nanowire/nanosheet 28 is spaced from a second structure adjacent to such layer by a second distance. The second structure is the substrate 11 and/or another layer of the second nanowire/nanosheet 28 adjacent to such layer. The first distance is greater than the second distance. A quantity of the layers of the first nanowire/nanosheet 32 in the first GAA transistor is less than a quantity of the layers of the second nanowire/nanosheet 28 in the second GAA transistor.

For each of the first GAA transistor and the second GAA transistor, a structure, a material of the structure, and specifications of the structure may refer to the foregoing description and are not repeated herein. A sequence of forming the first GAA transistor and the second GAA transistor on the substrate may be configured based on an actual application scenario. The first GAA transistor and the second GAA transistor may be simultaneously formed. Alternatively, the first GAA transistor is formed on the substrate before forming the second GAA transistor. Alternatively, the second GAA transistor is formed on the substrate before forming the first GAA transistor.

As an example, forming the first GAA transistor in the first region includes following steps.

Reference is made to FIG. 2 to FIG. 25. At least two first material layers 1211 is formed on the first region 111, and a first source 23 and a first drain 24 of the first GAA transistor is formed on the first region 111. The at least two first material layers 1211 are disposed between the first source 23 and the first drain 24, and are each in contact with the first source 23 and the first drain 24. Each first material layers 1211 is spaced from a third structure adjacent to such first material layer by a third distance. The third structure is the substrate 11 and/or another first material layers 1211 adjacent to such first material layer 1211. The third distance is greater than zero and less than the first distance.

In an embodiment, the at least two first material layers include at least one to-be-preserved layer and at least one to-be-removed layer. The to-be-preserved layer refers to the first material layer which is disposed in the first region and forms at least a part of the first nanowire/nanosheet in a final structure. The to-be-removed layer refers to the first material layer which is disposed in the first region and does not form the first nanowire/nanosheet in the final structure. The third structure(s) adjacent to the first material layer differ according to a sequential number of the first material layer. Details of the third structure may refer to the foregoing description concerning the first structure, and are not repeated herein. When manufacturing a semiconductor device according to an embodiment of the present disclosure, the large first distance between layers of the first nanowire/nanosheet is achieved in a follow manner. The at least two first material layers among which the third distance is small is first formed in the first region, and then the to-be-removed layer is removed from these first material layers. Thereby, magnitude of the third distance can be configured according to the first distance and an actual requirement.

In actual application, only the first region may be processed to form the first source, the first drain, and the at least two first material layers in the first region. Alternatively, both the first region and the second region may be processed, so as to form the first source, the first drain, and the at least two first material layers in the first region while forming a second source, a second drain, and at least two first material layers in the second region. In the latter case, the at least two first material layers in both the first region and the second region may be manufactured based on at least the same stacking material periods. A process is simplified and a cost is reduced when manufacturing the semiconductor device.

Figure 8:
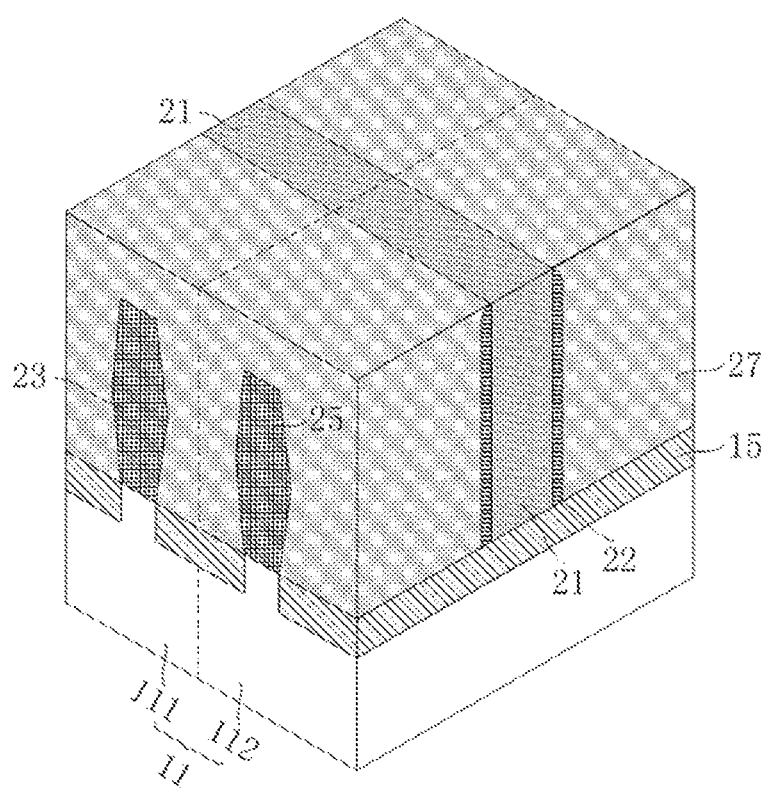
FIG. 8 is a schematic diagram of a structure after forming a dielectric layer according to an embodiment of the present disclosure.
Figure 9:
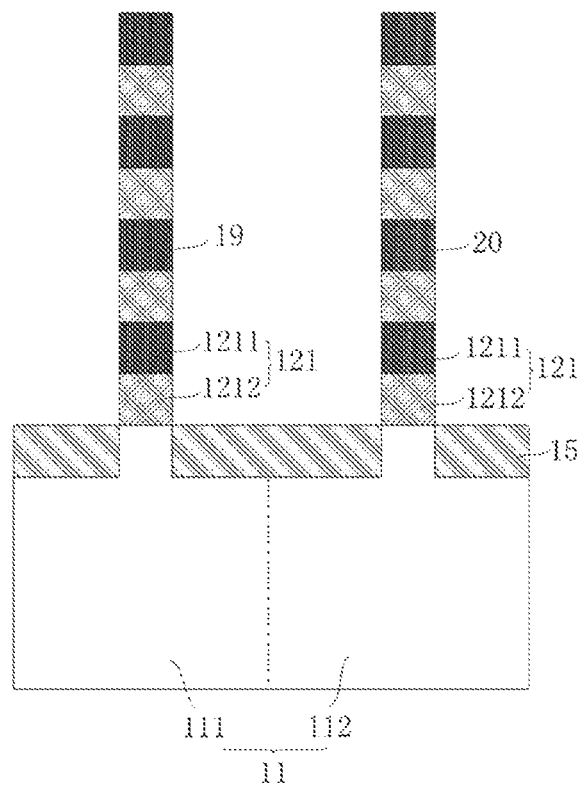
FIG. 9 is a structural diagram of a section along direction A-A' after removing a sacrificial gate according to an embodiment of the present disclosure.
Figure 10:
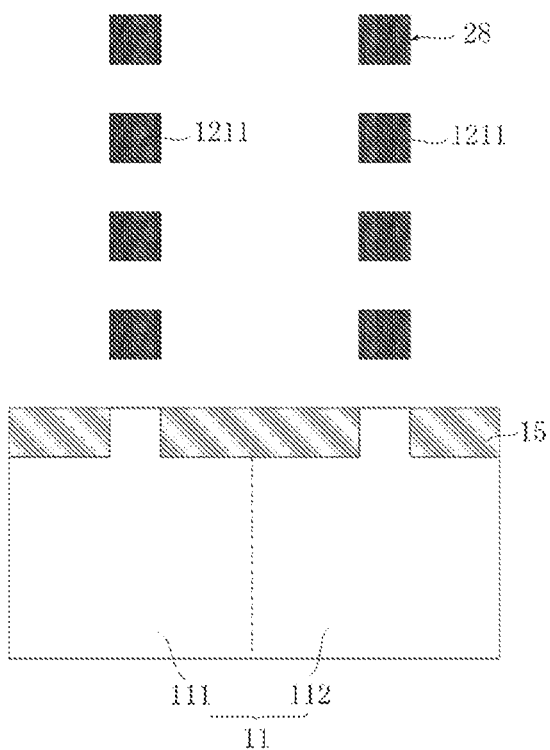
FIG. 10 is a structural diagram of a section along direction A-A' after forming at least two first material layers in each of a first region and a second region according to an embodiment of the present disclosure.
Figure 11:
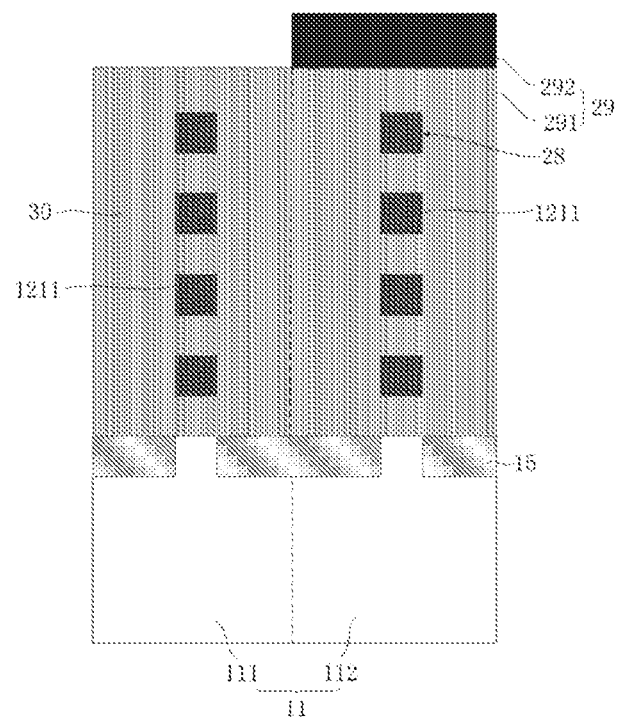
FIG. 11 is a structural diagram of a section along direction A-A' after forming a first mask layer and a second mask layer according to an embodiment of the present disclosure.

As an example, the first source, the first drain, and the at least two first material layers are formed in the first region, and simultaneously the second source, the second drain, and the at least two first material layers are formed in the second region. In such case, the third distance is equal to the second distance. Reference is made to FIG. 2 to FIG. 10. The first GAA transistor is formed in the first region 111, and the second GAA transistor is formed the second region 112, which may include following steps. Reference is made to FIG. 2 to FIG. 9. A first stacking structure 19, the first source 23, and the first drain 24 are formed in the first region 111, and a second stacking structure 20, a second source 25, and a second drain 26 are formed in the second region 112. The first stacking structure 19 is disposed between the first source 23 and the first drain 24, and is in contact with the first source 23 and the first drain 24. The second stacking structure 20 is disposed between the second source 25 and the second drain 26, and is in contact with the second source 25 and the second drain 26. Along a thickness direction of the substrate 11, each of the first stacking structure 19 and the second stacking structure 20 includes at least one stacking period 121. Each stacking period 121 includes a third material layer 1212 and a first material layer 1211 on the third material layer 1212. A material of the third material layer 1212 is different from that of the first material layer 1211. Reference is further made to FIG. 10. The third material layer(s) in the first region 111 and in the second region 112 are removed, so as to form the at least two exposed first material layers 1211 in the first region 111 and in the second region 112.

Figure 2:
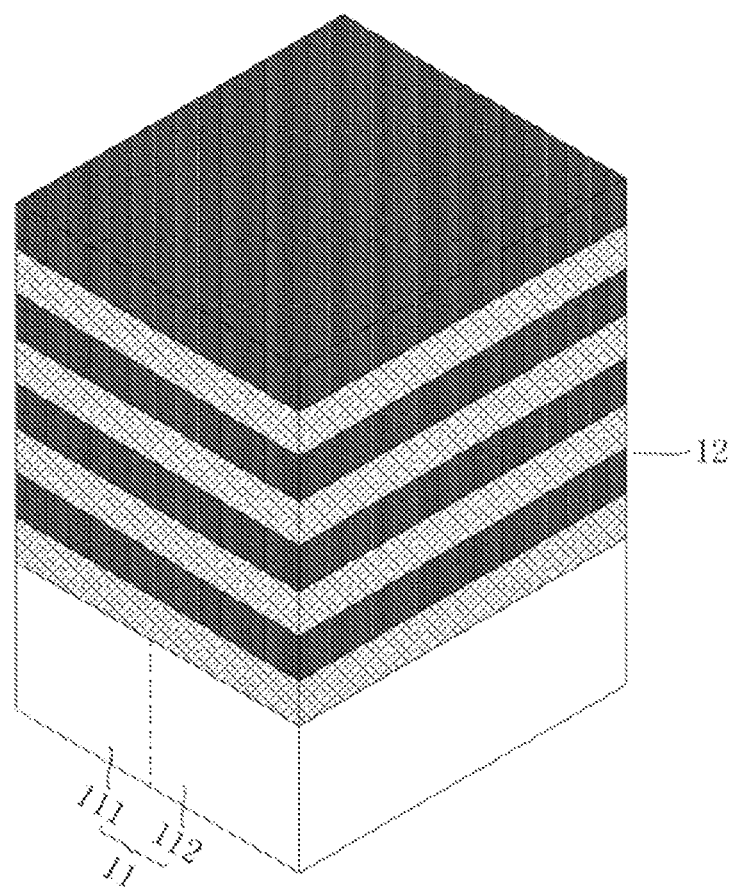
FIG. 2 is a schematic diagram of a structure after forming at least two stacking material periods on a substrate according to an embodiment of the present disclosure.
Figure 3:
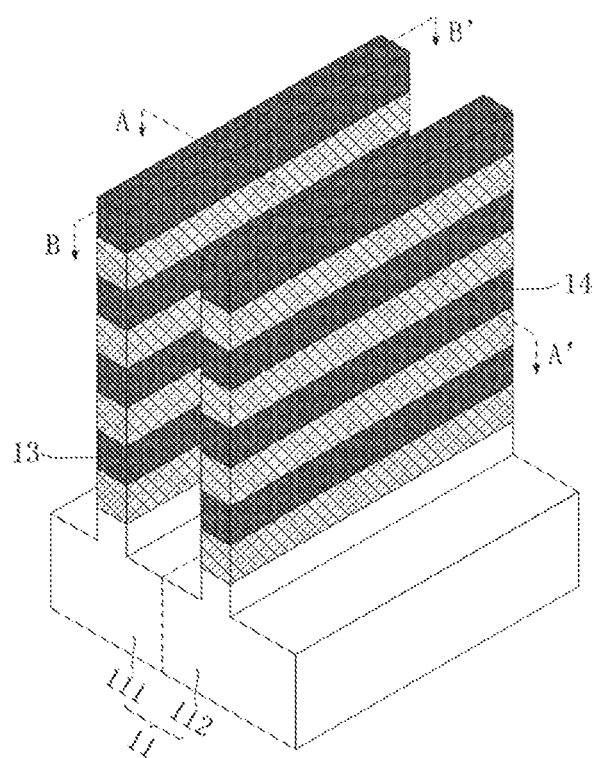
FIG. 3 is a schematic diagram of a structure after forming a first fin structure and a second fin structure according to an embodiment of the present disclosure.
Figure 4:
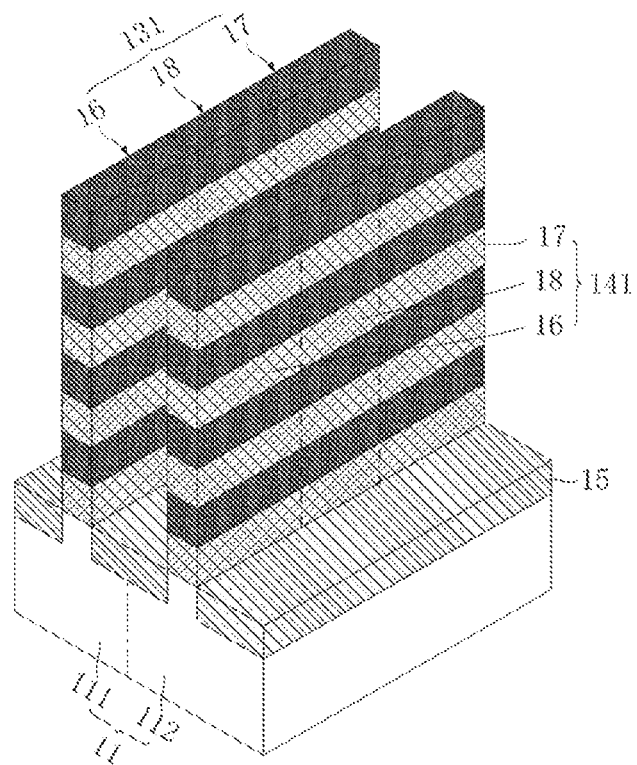
FIG. 4 is a schematic diagram of a structure after forming shallow trench isolation according to an embodiment of the present disclosure.
Figure 5:
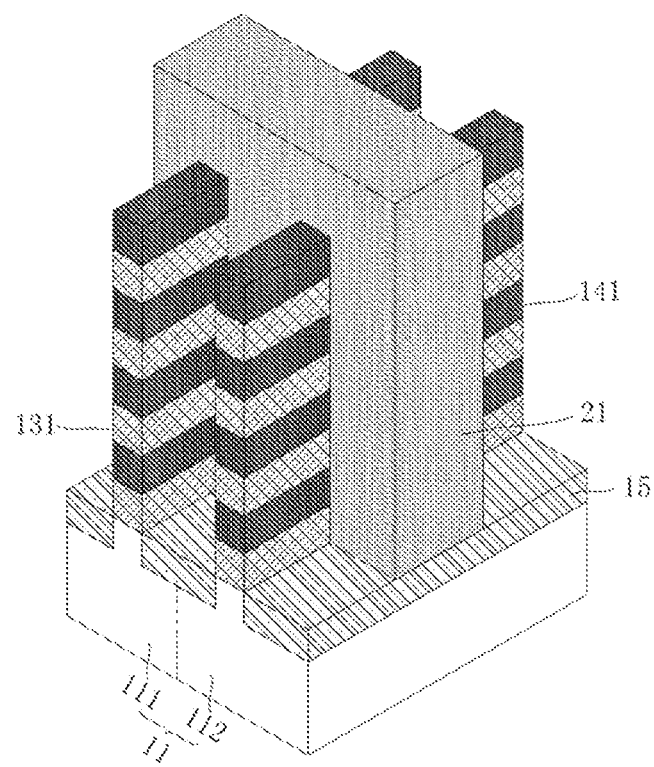
FIG. 5 is a schematic diagram of a structure after forming a sacrificial gate according to an embodiment of the present disclosure.
Figure 6:
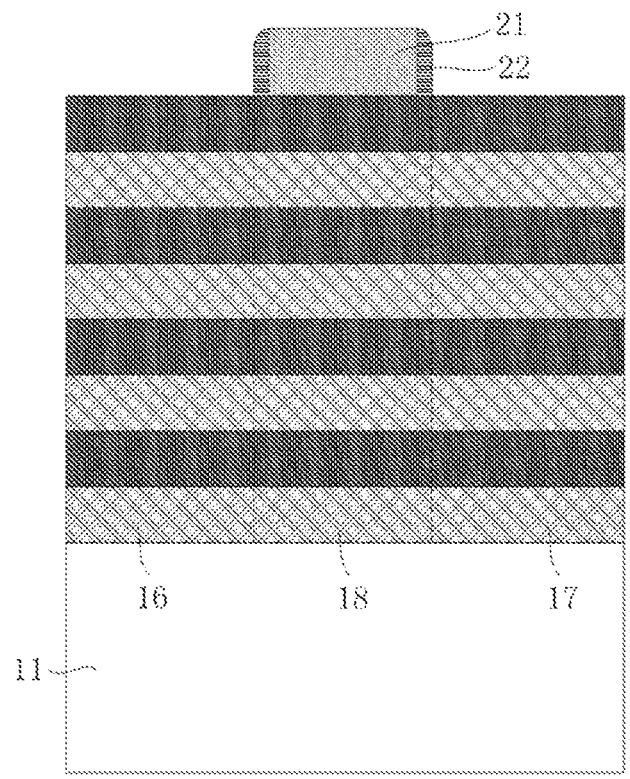
FIG. 6 is a structural diagram of a section along direction B-B' after forming sidewalls according to an embodiment of the present disclosure.
Figure 7:
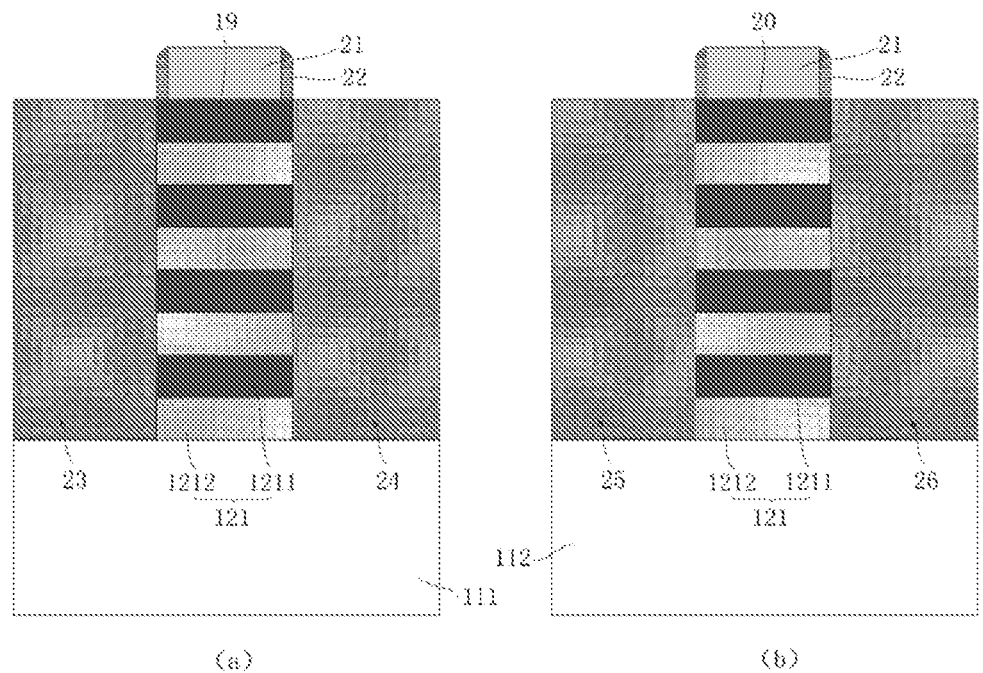
FIG. 7 is structural diagrams of sections along direction B-B' at a first stacking structure and a second stacking structure, respectively, after forming a first source, a first drain, the first stacking structure, a second source, a second drain, and the second stacking structure according to an embodiment of the present disclosure.

Reference is made to FIG. 2. In an actual application, at least two stacking material periods 12 for manufacturing the first stacking structure and the second stacking structure may be formed on the substrate 11 along the thickness direction of the substrate 11 through epitaxial growth or other techniques. A quantity of layers in the stacking material periods 12 is equal to a quantity of layers in the first stacking structure, and is also equal to a quantity of layers in the second stacking structure. In addition, the stacking material periods 12 are made of same materials as the first stacking structure and the second stacking structure. Reference is made to FIG. 3. The stacking material periods 12 and the substrate 11 may be etched from top to bottom through photolithography and etching, in order to form a first fin structure 13 in the first region 111 and a second fin structure 14 in the second region 112. The first fin structure 13 and the second fin structure 14 may extend along the same direction or different directions. An etching depth of the substrate 11 is greater than or equal to a thickness of shallow trench isolation, and is less than a thickness of the substrate 11. Reference is made to FIG. 4. The shallow trench isolation 15 is formed on the exposed substrate 11 out of the first fin structure or the second fin structure. A material in the shallow trench isolation 15 may refer to the foregoing description, and is not repeated herein. A part of the first fin structure exposed from the shallow trench isolation 15 is called a first fin 131, and a part of the second fin structure exposed from the shallow trench isolation 15 is called a second fin 141. Each of the first fin 131 and the second fin 141 is provided with a source region 16, a drain region 17, and a transition region 18 between the source region 16 and the drain region 17. Reference is made to FIG. 5 and FIG. 6. For each of the first fin 131 and the second fin 141, a sacrificial gate 21 and sidewalls 22 covering (i.e., disposed around) the transition region 18 may be formed through techniques such as deposition and selective etching. The sacrificial gate 21 extends along a direction different from extending directions of the first fin 131 and the second fin 141. The sidewall 22 is formed at least on two sides of the sacrificial gate 21 along a width direction of the sacrificial gate 21. A portion of the first fin and a portion of the second fin, which are in the source region and the drain region, are removed with the sacrificial gate and the sidewall serving as a mask. Reference is made to FIG. 7. The first source 23, the first drain 24, the second source 25, and the second drain 26 are formed, synchronously or asynchronously, through deposition and other techniques. Reference is made to FIG. 8. A dielectric layer 27 covering the first region 111 and the second region 112 is formed through deposition, chemical mechanical polishing, and techniques. A top of the dielectric layer 27 is flush with a top of the sacrificial gate 21. Reference is further made to FIG. 9. The sacrificial gate may be removed through dry etching or wet etching. Thereby, a part of the stacking material periods in the transition region of the first fin is exposed as the first stacking structure 19, and a part of the stacking material periods within the transition region of the second fin is exposed as the second stacking structure 20. Materials and thicknesses of the first material layer 1211 in the first stacking structure 19 and the second stacking structure 20 may refer to the foregoing description, and are not repeated herein. A material of the third material layer 1212 may be $Si_{1-s}Ge_s$, where $0 \leq s \leq 1$. In a case that a material of the first material layer 1211 is $Si_{1-y}Ge_y$, there is $|y-s| \geq 0.2$. In such case, there is etch selectivity between the first material layer 1211 and the third material layer 1212, such that the first material layer 1211 is less influenced by etching, rinsing, or other operations which are performed when removing the third material layer(s) 1212. Thereby, a yield of the semiconductor device can be improved. Reference is made to FIG. 10. At least two first material layers 1211 are obtained in each of the first region 111 and the second region 112, after removing the third material layers from the first region 111 and the second region 112 through techniques such as dry etching or wet etching. The at least two first material layers 1211 in the second region 112 serve as layers of the second nanowire/nanosheet 28 in the second GAA transistor. On such basis, each layer of the second nanowire/nanosheet 28 are spaced from the adjacent second structure by the second distance, and the above operations render the second distance equal to the third distance.

The first stacking structure, the first source, the first drain, the second stacking structure, the second source, and the second drain may be formed in various manners. How to form such structures may not be the key feature of embodiments of the present disclosure, and therefore is only briefly illustrated herein to facilitate those skilled in the art implementing the present disclosure. Those skilled in the art can deduce other manners for forming these structures.

Reference is made to FIG. 11 to FIG. 25. The at least two first material layers 1211 are sequentially exposed step-bystep and each is subject to etching or deposition, so as to obtain the first nanowire/nanosheet 32 in the first GAA transistor.

As discussed above, the at least two first material layers include at least one to-be-preserved layer and at least one to-be-removed layer. After the at least two first material layers are formed in the first region, it is necessary to remove (e.g., etch) the to-be-removed layer(s), which are sequentially exposed step-by-step. A second material layer is then formed (e.g., deposited) around the structure that is current exposed, including the to-be-preserved layer(s) which are also sequentially exposed step-by-step. The sequential exposure should be broadly interpreted. That is, the layers may be sequentially exposed from top to bottom based on sequential numbers of the first material layers, one layer at a time. Each first material layer is subject to deposition or etching based on whether it is the to-be-preserved layer or the to-be-removed layer. Alternatively, in a case that there are at least two to-be-removed layers that are adjacent, these to-be-removed layers may be simultaneously exposed and then removed, which improves efficiency and reduces cost of manufacturing. The etching and the deposition may be performed in different sequences with respect to the whole of the first material layers, because the topmost layer of the first nanowire/nanosheet may have different positional relationships with the topmost first material layer. On such basis, the first nanowire/nanosheet may be formed in following two manners.

Figure 20:
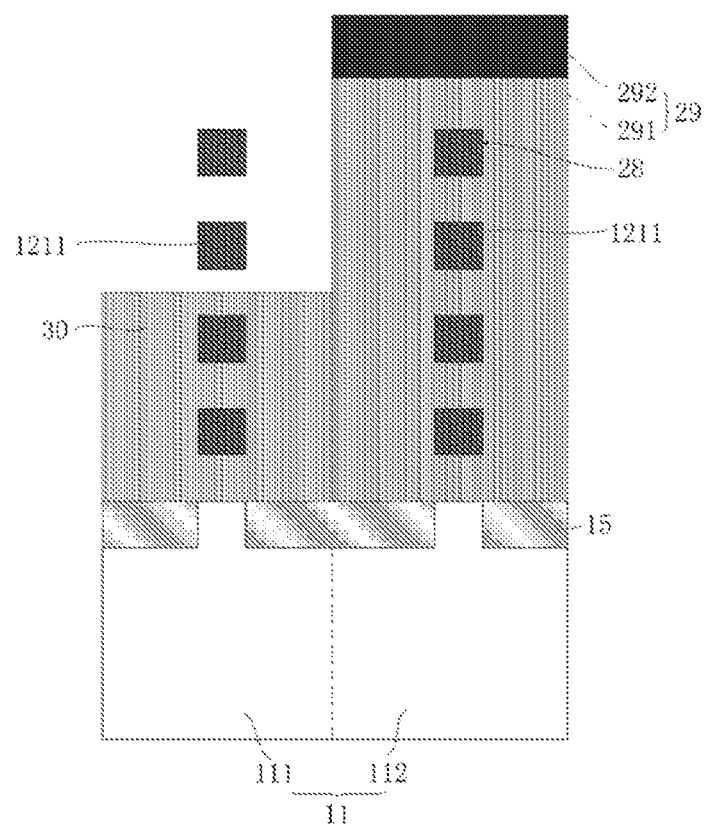
FIG. 20 is a structural diagram of a section along direction A-A' after performing first etch-back on a second mask layer according to another embodiment of the present disclosure.
Figure 21:
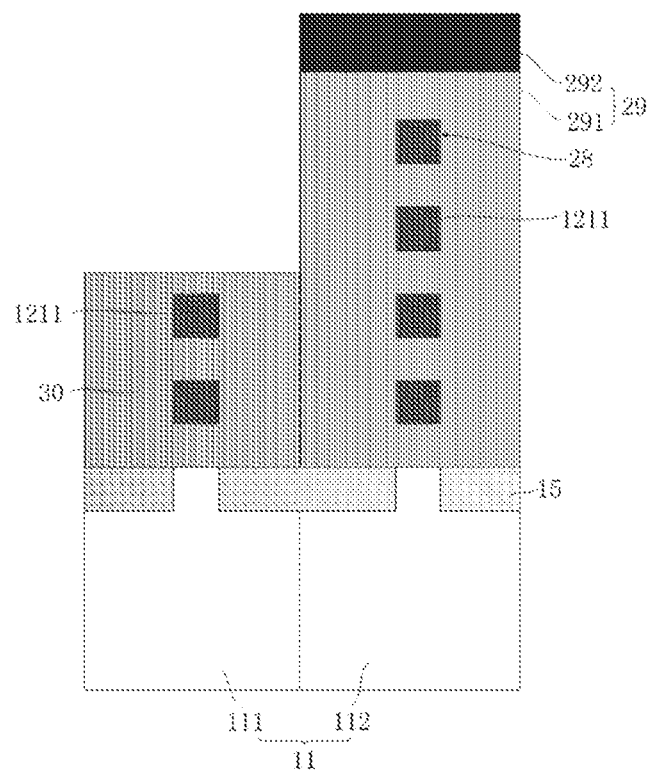
FIG. 21 is a structural diagram of a section along direction A-A' after removing an exposed to-be-removed layer according to another embodiment of the present disclosure.
Figure 22:
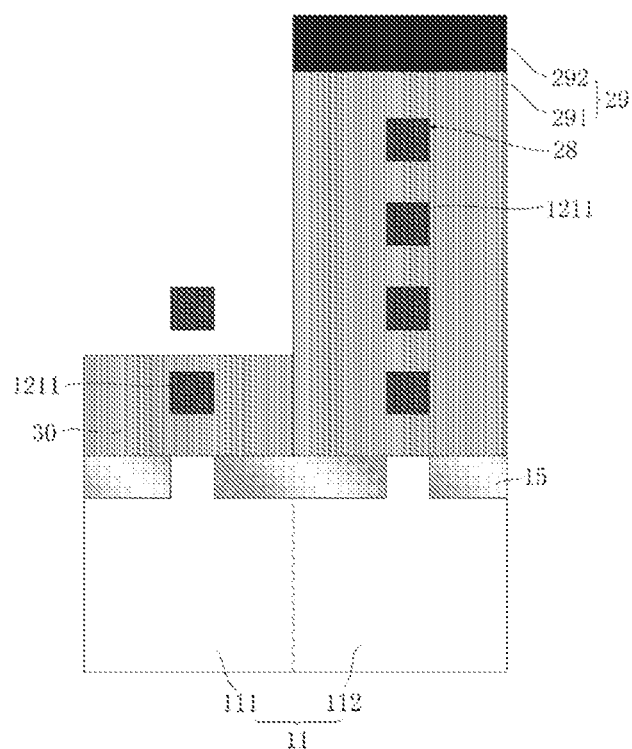
FIG. 22 is a structural diagram of a section along direction A-A' after performing second etch-back on a second mask layer according to another embodiment of the present disclosure.
Figure 23:
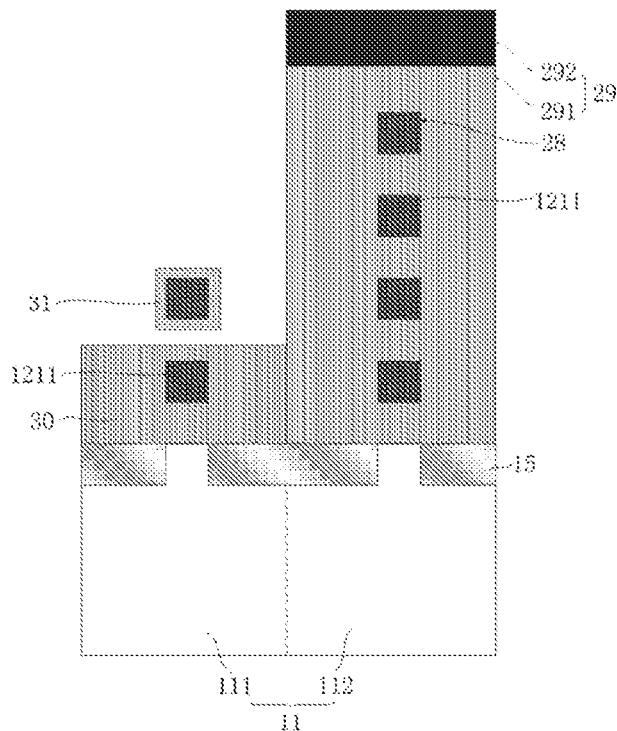
FIG. 23 is a structural diagram of a section along direction A-A' after forming a second material layer around an exposed structure according to another embodiment of the present disclosure.

A first manner may refer to FIG. 20 to FIG. 24. The topmost layer of the first nanowire/nanosheet includes a first material layer which is neither the topmost first material layer nor the bottommost first material layer. In such case, processing the at least two first material layers, which are exposed layer by layer a process, through etching or deposition to obtain the first nanowire/nanosheet 32 in the first GAA transistor includes the following steps. Reference is made to FIG. 20. A second mask layer 30 in the first region 111 is subject to first etchback with a first mask layer 29 serving as the mask, and the first etchback is performed until the to-be removed layer(s) above the topmost to-be-preserved layer are completely exposed. A top of the second mask layer 30 after the first etchback is lower than a lowest bottom of the exposed to-be-removed layer(s), and higher than a top of the topmost to-be-preserved layer. The to-be-preserved layer refers to the first material layer 1211 which overlaps at least partially with a corresponding layer of the first nanowires or nanosheet 32 in position. The to-be-removed layer refers to the first material layer 1211 which does not overlap with any layer of the first nanowire/nanosheet 32 in position. Reference is made to FIG. 21 and FIG. 22. The exposed to-be-removed layers are removed, and the second mask layer 30 is subject to second etchback to expose the topmost to-be-preserved layer. A top of the second mask layer 30 after the second etchback is lower than a bottom of the topmost to-be-preserved layer, and higher than a highest top of remaining to-be-removed layer(s). Reference is made to FIG. 23. A second material layer 31 is deposited around the exposed structure, such that the exposed to-be-preserved layer forms as at least a part of the corresponding layer of the first nanowire/nanosheet 32. A material of the second material layer 31 is different from that of the first material layer 1211. The above operations are repeated until the second material layer is formed around the bottommost to-be-preserved layer. Reference is made to FIG. 24. The remaining second mask layer and the remaining to-be-removed layer(s) are removed, so as to obtain the first nanowire/nanosheet 32 in the first GAA transistor.

Materials of the first mask layer and the second mask layer may be set based on an actual application scenario, and are not limited herein. For example, the first mask layer or the second mask layer may be a silicon oxide mask layer, a silicon nitride mask layer, an advanced patterned mask layer, a bottom-antireflection mask layer, or a spin-coated carbon mask layer. Reference is made to FIG. 11 to FIG. 25. The first mask layer 29 may include a first mask portion 291 and a second mask portion 292. The second mask portion 292 is disposed on the first mask portion 291. A top surface of the first mask portion 291 is flush with a top surface of the second mask layer 30, and a material of the first mask portion 291 is the same as that of the second mask layer 30.

In an actual application, the first mask layer and the second mask layers may be formed in difference manners based on different structures of the first mask layer. As an example, the first mask layer includes the first mask portion and the second mask portion. In such case, a first mask material layer covering the first region and the second region may be formed through chemical vapor deposition or other techniques. A part of the first mask material layer in the first region serves the second mask layer, while a part of the first mask material layer in the second region serves as the first mask portion. Then, a second mask material layer is formed on the first mask material layer through chemical vapor deposition or other techniques. The second mask material layer is subject to selective etching, such that only a part of the second mask material layer in the second region remains and forms the second mask portion. Thereby, the first mask layer is obtained. As another example, the material of the first mask layer is different from the material of the second mask layer. The first mask material layer may be first formed and then subject to selective etching, such that a part of the first mask material layer in the first region remains and forms the second mask layer. Then, a second mask material layer is deposited on the second mask layer and in the second region, and then subject to etchback, such that a part of the second mask material layer in the second region remains and forms the first mask layer. Alternatively, the second mask layer may be formed after forming the first mask layer.

Reference is made to FIG. 20 and FIG. 21. Since the topmost layer of the first nanowire/nanosheet 32 includes the first material layer 1211 which is neither the topmost first material layer nor the bottommost first material layer, it is necessary to remove the to-be-removed layer(s) above the topmost to-be-preserved layer before forming at least a part of the topmost layer of the first nanowire/nanosheet 32. Thereby, the second mask layer 30 may be subject to the first etchback through dry etching or wet etching, such that the to-be-removed layer(s) above the topmost to-be-preserved layer are completely exposed. At such time, the top of the second mask layer 30 after the first etchback is lower than a bottom surface of the lowest exposed to-be-removed layer and higher than a top of the topmost to-be-preserved layer, so that the topmost to-be-preserved layer is protected from subsequent etching or rinsing. Reference is made to FIG. 22. After the exposed to-be-removed layer(s) are removed, the second mask layer 30 is subject to the second etchback to expose the topmost to-be-preserved layer. A top of the second mask layer 30 after the second etchback is lower than a bottom of the topmost to-be-preserved layer, and higher than a top of the highest remaining to-be-removed layer, so that the to-be-removed layer(s) below the topmost to-be-preserved layer is not exposed. Thereby, it is prevented that the second material layer 31 is deposited around such to-be-removed layer(s) and thereby such to-be-removed layer(s) cannot be removed or can only be partially removed in a subsequent step, which improves a yield of the first GAA transistor. Reference is made to FIG. 23. The second material layer 31 is deposited around a structure that is current exposed, such that the currently exposed to-be-preserved layer forms at least a part of a corresponding layer of the first nanowire/nanosheet 32. In a case that such deposition is the first deposition operation, the exposed structure is a single to-be-preserved layer. In a case that such deposition is the second deposition operation, the currently exposed structure includes a to-be-preserved layer previously deposited with the second material layer 31 and a currently exposed to-be-preserved layer. In a similar manner, the currently exposed structure varies based on a quantity of deposition operations that has been performed. A required quantity of deposition operations (or a required quantity of repeated operation cycles) is determined by a quantity of layers of first nanowire/nanosheet 32 that need to be formed in the first region 111. Reference is made to FIG. 24. The remaining second mask layer 30 and the remaining to-be-removed layer(s) should be removed.

Reference is made to FIG. 20 to FIG. 24. It is taken as an example that there are four first material layers 1211 in the first region 111, among which the second first material layer 1211 is the to-be-preserved layer while the first, third, and fourth first material layers 1211 are the to-be-removed layers. Hereinafter a process of forming the first nanowire/nanosheet 32 is illustrated based on such example. First, the second mask layer 30 is subject to first etchback with the first mask layer 29 serving as a mask, and the first etchback is performed until the third and fourth first material layers 1211 are exposed. At such time, a top of the second mask layer 30 after the first etchback is lower than a bottom of the third first material layer 1211, and higher than a top of the second first material layer 1211. Then, the exposed third and fourth first material layers 1211 are removed. Afterwards, the second mask layer 30 is subject to the second etchback to expose the second first material layer 1211, and the second etchback is performed until the second first material layer 1211 is exposed. At such time, a top of the second mask layer 30 after the second etchback is lower than a bottom of the second first material layer 1211, and higher than a top of the first first material layer 1211. Then, a second material layer 31 is formed around the second first material layer 1211. Since only one layer of first nanowire/nanosheet 32 is required in the first region 111, the above operations are only performed once. Finally, the second mask layer 30 and the first first material layer 1211 are removed. Thereby, the first nanowire/nanosheet 32 is manufactured.

Figure 12:
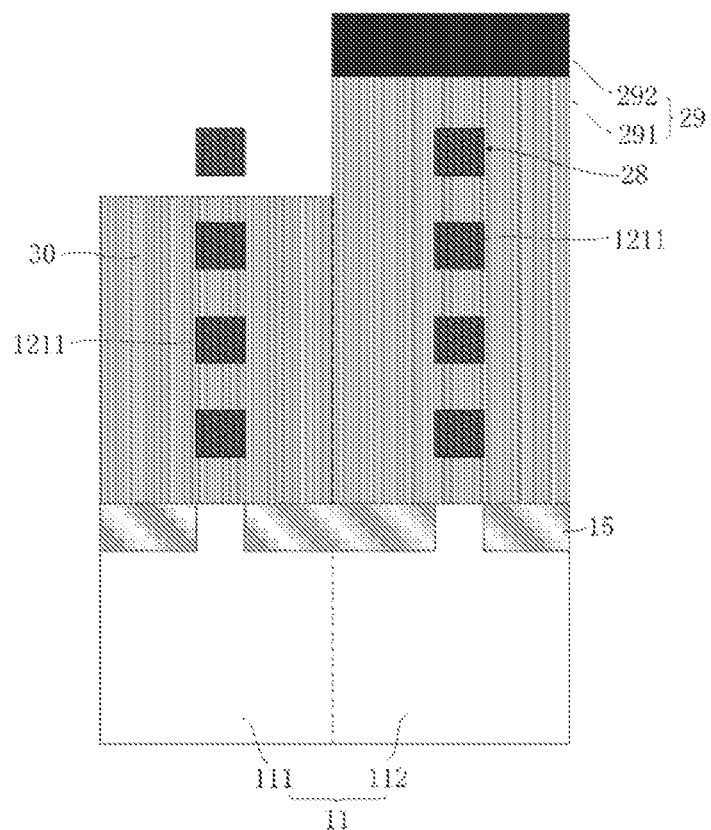
FIG. 12 is a structural diagram of a section along direction A-A' after performing first etch-back on a second mask layer according to an embodiment of the present disclosure.
Figure 13:
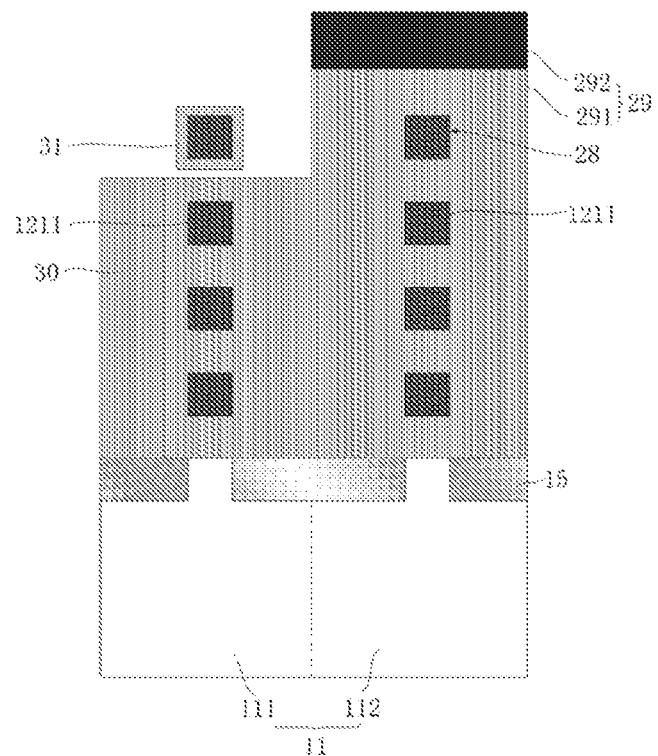
FIG. 13 is a structural diagram of a section along direction A-A' after forming a second material layer around an exposed structure according to an embodiment of the present disclosure.
Figure 14:
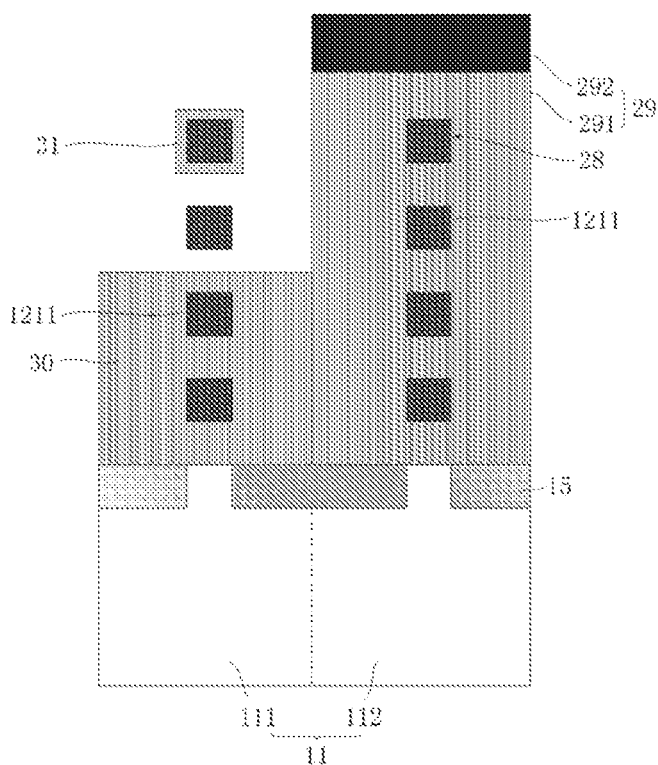
FIG. 14 is a structural diagram of a section along direction A-A' after performing second etch-back on a second mask layer according to an embodiment of the present disclosure.
Figure 15:
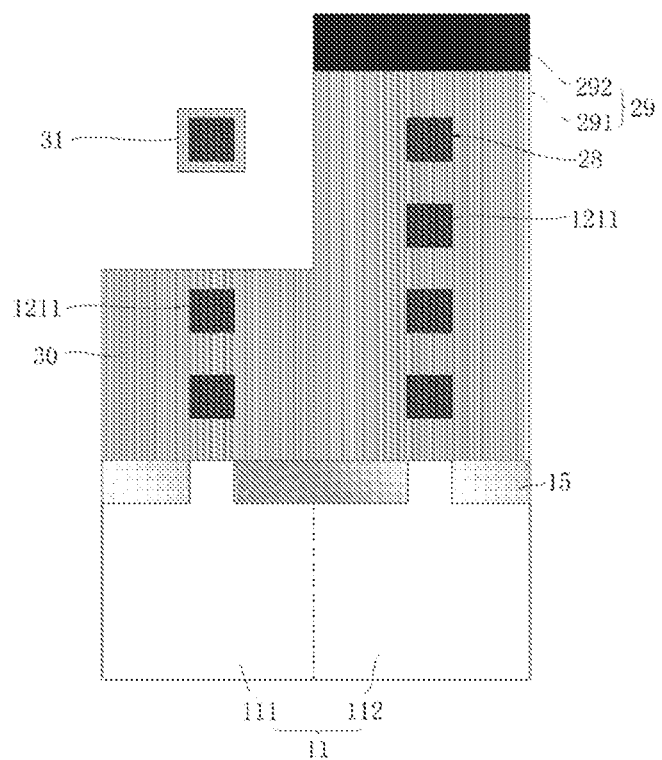
FIG. 15 is a structural diagram of a section along direction A-A' after removing an exposed to-be-removed layer according to an embodiment of the present disclosure.
Figure 16:
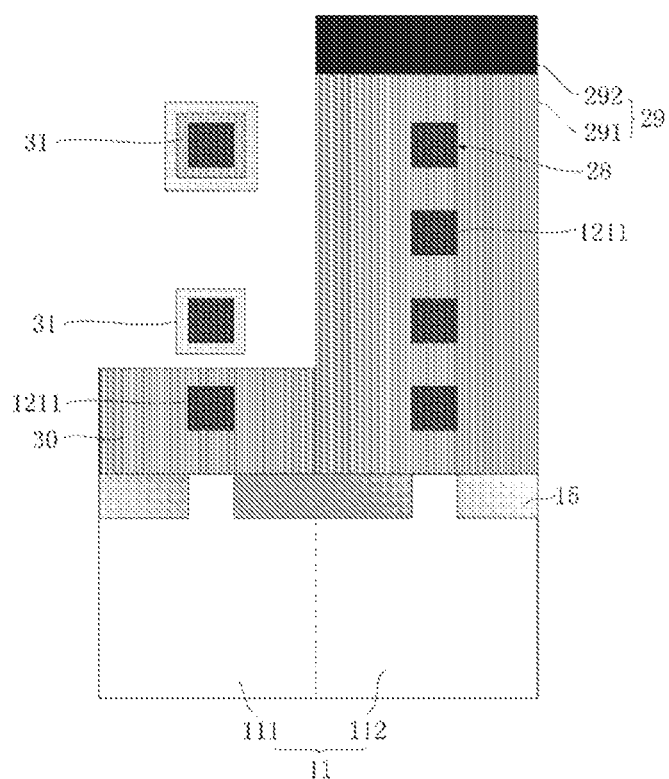
FIG. 16 is a structural diagram of a section along direction A-A' after performing first etch-back again on a second mask layer and then forming a second material layer around an exposed structure according to an embodiment of the present disclosure.
Figure 17:
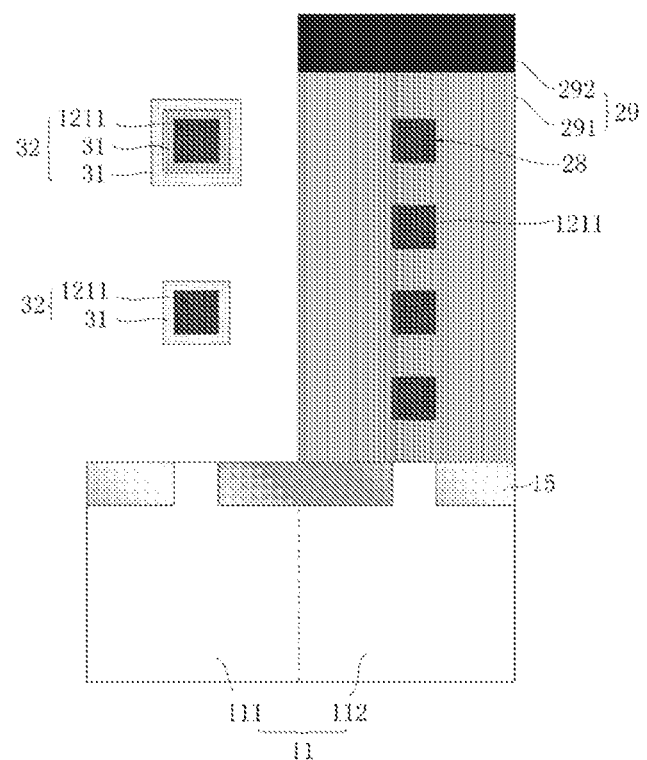
FIG. 17 is a structural diagram of a section along direction A-A' after removing a second mask layer and remaining to-be-removed layer(s) according to an embodiment of the present disclosure.

A second manner may refer to FIG. 12 to FIG. 16. The topmost layer of the first nanowire/nanosheet 32 includes the topmost first material layer 1211. In such case, processing the at least two first material layers, which are exposed layer by layer a process, through etching or deposition to obtain the first nanowire/nanosheet 32 in the first GAA transistor includes the following steps. Reference is made to FIG. 12. The second mask layer 30 in the first region 111 is subject to first etchback with the first mask layer 29 serving as a mask, and the first etchback is performed until the topmost to-be-preserved layer is exposed. A top of the second mask layer 30 after the first etchback is lower than a bottom surface of the topmost to-be-preserved layer, and higher than a top of the highest remaining to-be-removed layer. The to-be-preserved layer refers to the first material layer 1211 which overlaps at least partially with a corresponding layer of the first nanowires or nanosheet 32 in position. The to-be-removed layer refers to the first material layer 1211 which does not overlap with any layer of the first nanowire/nanosheet 32 in position. Reference is made to FIG. 13. A second material layer 31 is deposited around a structure that is currently exposed, such that the exposed to-be-preserved layer forms at least a part of the corresponding layer of the first nanowire/nanosheet 32. A material of the second material layer 31 is different from that of the first material layers 1211. Reference is made to FIG. 14. The second mask layer 30 is subject to second etchback, and the second etchback is performed until to-be-removed layer(s) between a bottom of the deposited second material layer 31 and the topmost to-be-preserved layer unexposed before the second etchback. A top of the second mask layer 30 after the second etchback is lower than a bottom of the lowest exposed to-be-removed layer, and higher than a top of the topmost to-be-preserved layer unexposed before the second etchback. Reference is made to FIG. 15. The exposed to-be-removed layer(s) are removed. Reference is made to FIG. 16. The above operations are repeated until the second material layer 31 has been formed around the bottommost to-be-preserved layer. Reference is made to FIG. 17. The remaining second mask layer and the remaining to-be-removed layer(s) are removed to obtain the first nanowire/nanosheet 32 in the first GAA transistor.

Since the topmost layer of the first nanowire/nanosheet includes the topmost first material layer, it is necessary to first perform deposition on the topmost to-be-preserved layer and then etch the to-be-removed layer(s) between the two topmost to-be-preserved layers. Operations of the first etchback and the second etchback may refer to the foregoing description, and are not repeated herein.

Reference is made to FIG. 17 to FIG. 19, FIG. 24, and FIG. 25. After removing the remaining to-be-removed layer(s), the method further includes removing at least a part of the second material layer(s) 31, in a case that a material of the first nanowire/nanosheet 32 is the same as that of the second nanowire/nanosheet 28, or that only a part of the layers of the first nanowire/nanosheet 32 includes the second material layer 31. Which second material layer 31 needs to be removed may be determined based on a condition of the second material layer 31 included in each layer of the final first nanowire/nanosheet 32, and is not limited herein.

Figure 19:
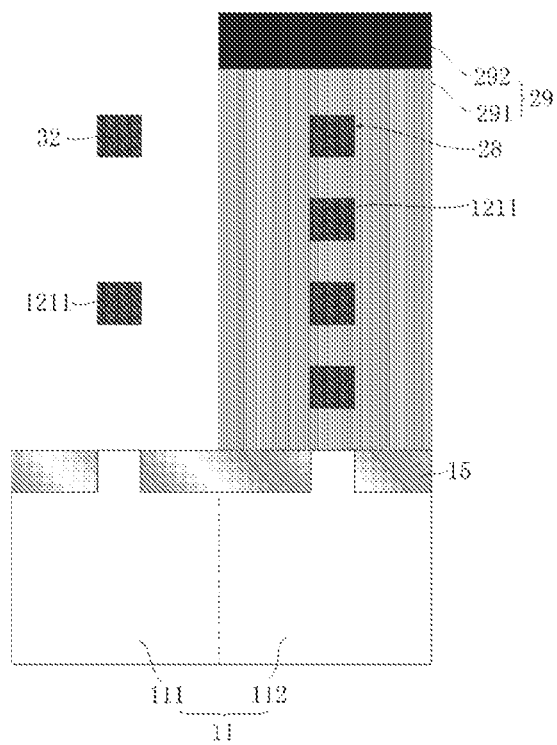
FIG. 19 is a structural diagram of a section along direction A-A' after removing a second material layer completely according to an embodiment of the present disclosure.

Reference is made to FIG. 19 and FIG. 25. As an example, the first nanowire/nanosheet 32 and the second nanowire/nanosheet 28 are identical in material. In such case, it is necessary to remove the second material layer around each layer of the first nanowire/nanosheet 32 in the first region 111, after removing the remaining to-be-removed layer(s).

Figure 18:
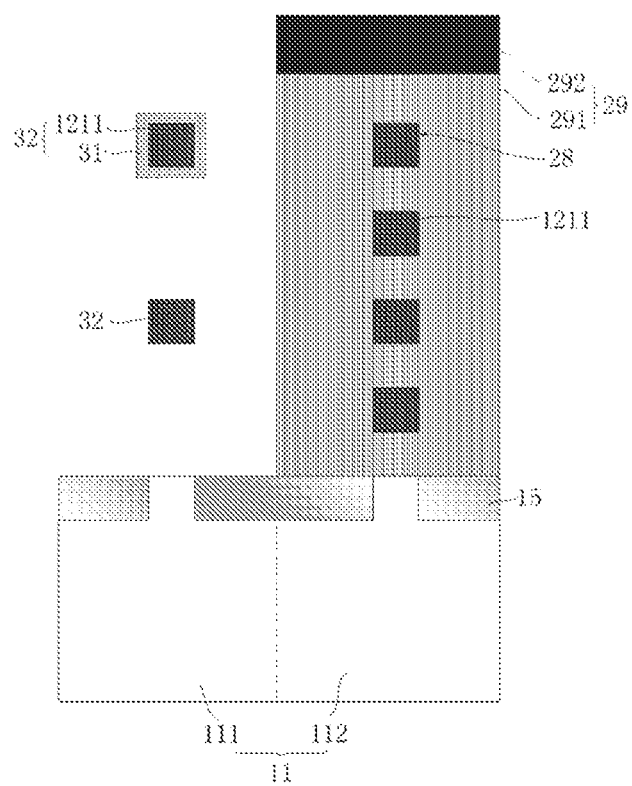
FIG. 18 is a structural diagram of a section along direction A-A' after removing a second material layer of a partial thickness according to an embodiment of the present disclosure.

Reference is made to FIG. 18. As an example, only a part of the layers of the first nanowires or nanosheet 32 includes the second material layer 31. In such case, it is necessary to thin the second material layer 31 around each first material layer 1211. A thickness of the removed second material layer 31 is determined based on the largest thickness among the second material layers 31, which have been formed around the layers of the nanowire/nanosheet 32 that would not include the second material layer 31 in the final structure. An example is as shown in FIG. 18. Two layers of the first nanowire/nanosheet 32 are formed in the first region 111, and the first layer of the first nanowire/nanosheet 32 does not include the second material layer 31 in the final structure. In such case, when manufacturing, it is necessary to thin the second material layer 31 around the second first material layer 1211 by a thickness equal to a thickness of the second material layer 31 that has been formed around the first first material layer 1211.

Reference is made to FIGS. 28 to 31. As an example, the first GAA transistor serves as an input/output transistor, and a first gate dielectric layer 33 in the first GAA transistor includes a gate oxide layer 331 and a gate insulation layer 332 on the gate oxide layer 331. The gate oxide layer 331 is formed at least around the first nanowire/nanosheet 32. In such case, the first GAA transistor may be formed in two following manners according to different positions of the gate oxide layer 331.

Figure 26:
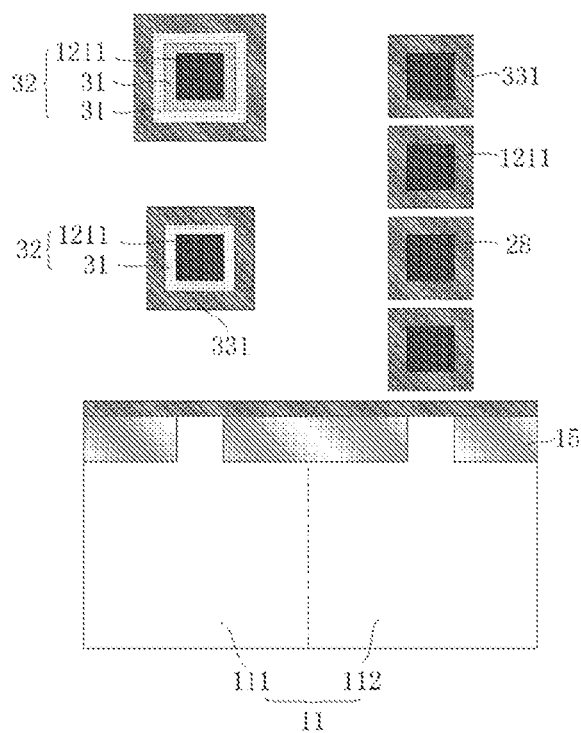
FIG. 26 is a structural diagram of a section along direction A-A' after forming a gate oxide layer in a first region and a second region according to an embodiment of the present disclosure.

In a first manner, after obtaining the first nanowire/nanosheet in the first GAA transistor, a process of forming the first GAA transistor in the first region further includes following steps. Reference is made to FIG. 26. A gate oxide layer 331 is formed at least around the first nanowire/nanosheet 32, and around the at least two first material layers 1211 in the second region 112. Reference is made to FIG. 27. The gate oxide 331 is selectively removed from the second region 112. Reference is made to FIG. 28 to FIG. 31. The gate insulation layer 332 and a first gate 34 of the first GAA transistor are sequentially formed on the gate oxide layer 331. Thereby, the first GAA transistor is obtained.

In an actual application, after the first nanowire/nanosheet is formed in the first region and the first mask layer is removed from the second region, the first nanowire/nanosheet and the at least two first material layers (i.e., the second nanowire/nanosheet) in the second region are both exposed. On such basis, the gate oxide layer would be formed around both the first nanowire/nanosheet and the at least two first material layers in the second region. In addition, the gate oxide layer may be further formed on the substrate. A process of forming the gate oxide layer may be determined based on an actual application scenario. As an example, the gate oxide layer may be formed through atomic layer deposition or in-situ steam generation. The atomic layer deposition enables forming the gate oxide layer on the above structure, which does not influence a dimension of the above structure. The in-situ water vapor generation forms the gate oxide layer by sacrificing partial thickness of the above structure, and hence may reduce a dimension of the above structure. Hence, an appropriate technique may be determined based on a required dimension of the structure in an actual application scenario. Then, the gate oxide layer around the at least two first material layers in the second region is selectively removed with a third mask layer (not shown) serving as a mask, such that the gate oxide layer around the first nanowire/nanosheet is retained. Afterwards, the gate insulation layer and the first gate are sequentially formed on the gate oxide layer through atomic layer deposition or other techniques. Thereby, the first GAA transistor is formed.

In a second manner, after obtaining the first nanowire/nanosheet in the first GAA transistor, a process of forming the first GAA transistor in the first region further includes following steps. Reference is made to FIG. 27. A gate oxide layer 331 is formed at least around the first nanowire/nanosheet 32 in the first region 111. Reference is made to FIG. 28 to FIG. 31. The gate insulation layer 332 and the first gate 34 in the first GAA transistor are sequentially formed on the gate oxide layer 331. Thereby, the first GAA transistor is formed.

In an actual application, the first mask layer still covers the second region after the first nanowire/nanosheet is formed in the first region. At such time, only the first nanowire/nanosheet in the first region is exposed. On such basis, the gate oxide layer can be selectively formed around the first nanowire/nanosheet through the aforementioned techniques with the first mask layer serving as a mask. Correspondingly, the gate oxide layer may be also formed on a part of the substrate in the first region. Afterwards, a gate insulation layer and a first gate may be sequentially formed on the gate oxide layer through the aforementioned techniques. Thereby, the first GAA transistor is formed.

After forming the second nanowire/nanosheet in the second region and before forming the first gate dielectric layer, a second gate dielectric layer and a second gate may be formed sequentially through atomic layer deposition or other techniques for the second GAA transistor. Alternatively, the second gate dielectric layer and the second gate may be sequentially formed at least on the exposed second nanowire/nanosheet through the aforementioned techniques after forming the first GAA transistor. Alternatively, the first gate dielectric layer is identical to the second gate dielectric layer in material and thickness. In such case, the first gate dielectric layer and the second gate dielectric layer may be simultaneously formed, and then the first gate and the second gate are separately formed in different steps. In another embodiment, the first gate dielectric layer is different from the second gate dielectric layer in material and/or thickness, and the first gate is identical to the second gate in material and thickness. In such case, the first gate dielectric layer and the second gate dielectric layer may be separately formed in different steps, and then the first gate and the second gate are simultaneously formed.

Apparently, the first gate dielectric layer, the first gate, the second gate dielectric layer, and the second gate may be formed in another appropriate manner and/or another appropriate sequence. Materials and thicknesses of the first gate dielectric layer, the first gate, the second gate dielectric layer, and the second gate may refer to the foregoing description, and are not repeated herein.

In the above description, technical details, for example, concerning composition of each layer and etching, are not described in detail. Those skilled in the art can implement a region, a layer, or the like, having a desired shape through various technical means. Those skilled in the art may further deduce a means which is not exactly the same as the aforementioned means when forming the same structure. Although the embodiments are separately described as above, it does not mean that these embodiments cannot be advantageously combined and applied.

Hereinabove described are embodiments of the present disclosure. These embodiments are only intended for illustration instead of limiting the scope of the present disclosure. The scope of the present disclosure is defined by the appended claims and their equivalents. Those skilled in the art can make various modifications and variations based on the present disclosure, and the modifications and variations shall fall within the scope of the present disclosure.

The invention claimed is:

1. A semiconductor device, comprising:
a substrate, having a first region and a second region;
a first gate-all-around (GAA) transistor disposed in the first region, wherein the first GAA transistor comprises a first nanowire or nanosheet of at least one first layer, the at least one first layer and the substrate form a first group, and all pairs of adjacent layers among the first group are separated by first distances, respectively; and
a second GAA transistor disposed in the second region, wherein the second GAA transistor comprises a second nanowire or nanosheet of at least two second layers, the at least two second layers and the substrate form a second group, and all pairs of adjacent layers among the second layers are separated by second distances, respectively;
wherein a minimum one of the first distances is greater than a maximum one of the second distances, and a quantity of the at least one first layer is less than a quantity of the at least two second layers;

wherein the at least one first layer and the at least two second layers each comprises a first material layer; and wherein each first layer of the at least one first layer corresponds to a respective second layer of the at least one two second layers, and a distance between the substrate and the first material layer of each first layer is identical to a distance between the substrate and the first material layer of the respective second layer corresponding to said first layer.

2. The semiconductor device according to claim 1, wherein the first GAA transistor comprises a first gate stack disposed around each of the at least one first layer, the second GAA transistor comprises a second gate stack disposed around each of the at least two second layers, and a thickness of the first gate stack is larger than a thickness of the second gate stack.

3. The semiconductor device according to claim 2, wherein:

the first gate stack comprises a first gate dielectric layer and a first gate disposed on the first gate dielectric layer;

the second gate stack comprises a second gate dielectric layer and a second gate disposed on the second gate dielectric layer; and a thickness of the first gate dielectric layer is greater than a thickness of the second gate dielectric layer, or a thickness of the first gate is greater than a thickness of the second gate.

4. The semiconductor device according to claim 3, wherein:

a thickness of a first gate dielectric layer is greater than a thickness of a second gate dielectric layer, and the first GAA transistor serves as an input/output transistor, and the second GAA transistor serves as a core transistor.

5. The semiconductor device according to claim 3, wherein:

the first gate dielectric layer comprises a gate oxide layer disposed around each of the at least one first layer and a gate insulation layer disposed on the gate oxide layer.

6. The semiconductor device according to claim 1, wherein:

a quantity of the one or more first distances are greater than or equal to two, and one of the first distances is different from another of the first distances.

7. The semiconductor device according to claim 1, wherein:

one of the second distances is equal to another of the second distances.

8. The semiconductor device according to claim 1, wherein:

a material of each of the at least one first layer is same as a material of each of the at least two second layers.

9. The semiconductor device according to claim 1, wherein:

one or more of the at least one first layer each further comprises a second material layer surrounding the first material layer, and a material of the first material layer is different from a material of the second material layer.

10. The semiconductor device according to claim 9, wherein:

at least two first layers among the at least one first layer each comprises the first material layer and the second material layer surrounding the first material layer; and one of the at least two first layers is different from another of the at least two first layers in a thickness of the second material layer.

11. A method for manufacturing a semiconductor device, comprising:

providing a substrate having a first region and a second region; and forming a first GAA transistor in the first region and a second GAA transistor in the second region;

wherein:

the first GAA transistor comprises a first nanowire or nanosheet of at least one first layer, the at least one first layer and the substrate form a first group, and all pairs of adjacent layers among the first group are separated by first distances, respectively;

the second GAA transistor comprises a second nanowire or nanosheet of at least two second layers, the at least two second layers and the substrate form a second group, and all pairs of adjacent layers among the second layers are separated by second distances, respectively;

a minimum one of the first distances is greater than a maximum one of the second distance; and a quantity of the at least one first layer is less than a quantity of the at least two second layers;

the at least one first layer and the at least two second layers each comprises a first material layer; and each first layer of the at least one first layer corresponds to a respective second layer of the at least one two second layers, and a distance between the substrate and the first material of each first layer is identical to a distance between the substrate and the first material of the respective second layer corresponding to said first layer.

12. The method according to claim 11, wherein forming the first GAA transistor in the first region comprises:

forming, in the first region, at least two first material layers, a first source, and a first drain, wherein:

the at least two first material layers are disposed between the first source and the first drain, and in contact with the first source and the first drain;

the at least two first material layers and the substrate form a third group, pairs of adjacent layers among the third group are separated by third distances, respectively, and each of the first distances corresponding to one or more of the third distances and is greater than each of the one or more corresponding third distances; and the at least two first material layers comprises one or more to-be-removed layers and one or more to-be-preserved layers, and the to-be-preserved layers are in one-to-one correspondence with the at least one first layer; and removing the to-be-removed layers from the at least two first material layers to retain each of the to-be-preserved layer as a corresponding one of the at least one first layer, wherein each of the to-be-removed layers is not removed until all the to-be-preserved layers above said to-be-removed layer is exposed and then protected through deposition, and each of the to-be-preserved layers is not subject to the deposition until all the to-be-removed layers above said to-be-preserved layer is removed.

13. The method according to claim 12, wherein a topmost layer of at least one first layer corresponds to neither a topmost one nor a bottommost one of the at least two first material layers, and removing the to-be-removed layers comprises:

repeating iterative operations until a second material layer has been deposited on a bottommost one of the to-be-preserved layers, each of the iterative operations comprises:

etching a second mask layer covering the first region until one or more of the to-be-removed layers above a to-be-preserved layer are completely exposed, wherein the to-be-preserved layer is a topmost one of the to-be-preserved layer which is not exposed from the second material layer, a top of the etched second mask layer is lower than a bottom of a lowest one of the one or more exposed to-be-removed layers and higher than a top of the to-be-preserved layer;

removing the one or more exposed to-be-removed layers, and then etching the second mask layer until the to-be-preserved layer is exposed, wherein a top of the etched second mask layer is lower than a bottom of the to-be-preserved layer and higher than a top of a highest one of the to-be-removed layers that remain; and depositing a second material layer on the to-be-preserved layer, wherein a material of the second material layer is different from a material of the at least two first material layers; and removing a remaining part of the second mask layer and the to-be-removed layers that remain after repeating the iterative operations.

14. The method according to claim 12, wherein a topmost layer of first nanowire or nanosheet at least one first layer corresponds to a topmost one of the at least two first material layers, and removing the to-be-removed layers comprise comprises:

repeating iterative operations until a second material layer has been deposited on a bottommost one of the to-be-preserved layers, each of the iterative operations comprises:

etching a second mask layer covering the first region until a to-be-preserved layer is exposed, wherein the to-be-preserved layer is a topmost one of the to-be-preserved layer which is not exposed from the second material layer, a top of the etched second mask layer is lower than a bottom of the to-be-preserved layer and higher than a top of a highest one of the to-be-removed layers that remain;

depositing a second material layer on the to-be-preserved layer, wherein a material of the second material layer is different from a material of the at least two first material layers;

etching the second mask layer until one or more to-be-removed layers are exposed, wherein the one or more to-be-removed layers are all to-be-removed layers which are located between a bottom of the deposited second material layer and another to-be-preserved layer, the another to-be-preserved layer is one of the to-be-preserved layers which is immediately below the to-be-preserved layer, a top of the etched second mask layer is lower than a bottom of a lowest one of the one or more to-be-removed layers and higher than a top of the another to-be-preserved layer;

removing the exposed one or more to-be-removed layers; and removing a remaining part of the second mask layer and the to-be-removed layers that remain after repeating the iterative operations.

15. The method according to claim 13, after removing the to-be-removed layers that remain after repeating the iterative operations, the method further comprises:

removing at least a part of the second material layer.

16. The method according to claim 14, after removing the to-be-removed layers that remain after repeating the iterative operations, the method further comprises:

removing at least a part of the second material layer.

17. The method according to claim 12, wherein the third distances are equal to the second distances, respectively, and forming the first GAA transistor in the first region and the second GAA transistor in the second region comprises:

forming a first stacking structure, the first source, and the first drain in the first region, wherein the first stacking structure is disposed between the first source and the first drain, and is in contact with the first source and the first drain;

forming a second stacking structure, the second source, and the second drain in the second region, wherein the second stacking structure is disposed between the second source and the second drain, and is in contact with the second source and the second drain, each of the first stacking structure and the second stacking structure comprises at least two third material layers and the at least two first material which are alternately stacked and a material of the at least two third material layers is different from a material of the at least two first material layers; and removing the at least two third material layers from the first region and the second region.

18. The method according to claim 17, wherein:

forming the first GAA transistor in the first region further comprises:

forming, after the first nanowire or nanosheet is formed, a gate oxide layer around the first nanowire or nanosheet and the at least two first material layers in the second region;

removing the gate oxide layer from the second region; and forming a gate insulation layer and then a first gate on the gate oxide layer.

19. The method according to claim 17, wherein:

forming the first GAA transistor in the first region further comprises:

forming, after the first nanowire or nanosheet are formed, a gate oxide layer around the first nanowire or nanosheet in the first region; and forming a gate insulation layer and then a first gate on the gate oxide layer.

20. The method according to claim 18, wherein the gate oxide layer is formed through atomic layer depositions or in-situ steam generation.

\* \* \* \* \*